(12) United States Patent
Kuroda

(10) Patent No.: US 9,847,305 B2
(45) Date of Patent: Dec. 19, 2017

(54) SEMICONDUCTOR CHIP WITH MULTILAYER SOLENOID COIL AND MULTI-CHIP MODULE COMPRISING THE SAME

(71) Applicant: KEIO UNIVERSITY, Tokyo (JP)

(72) Inventor: Tadahiro Kuroda, Yokohama (JP)

(73) Assignee: KEIO UNIVERSITY, Tokyo (JP)

( * ) Notice: Subject to any disclaimer, the term of this patent is extended or adjusted under 35 U.S.C. 154(b) by 0 days.

(21) Appl. No.: 15/280,721

(22) Filed: Sep. 29, 2016

(65) Prior Publication Data

US 2017/0092603 A1   Mar. 30, 2017

(30) Foreign Application Priority Data

Sep. 30, 2015 (JP) ................................. 2015-195099

(51) Int. Cl.
| H01L 23/64 | (2006.01) |
| H01L 23/00 | (2006.01) |
| H01L 25/065 | (2006.01) |
| H01L 49/02 | (2006.01) |

(52) U.S. Cl.
CPC ............ H01L 23/645 (2013.01); H01L 24/48 (2013.01); H01L 25/0655 (2013.01); H01L 28/10 (2013.01); H01L 2224/48227 (2013.01); H01L 2224/48465 (2013.01)

(58) Field of Classification Search
CPC combination set(s) only.
See application file for complete search history.

(56) References Cited

U.S. PATENT DOCUMENTS

| 8,470,612 B2 * | 6/2013 | Hofmann .............. H01F 41/046 257/531 |
| 2007/0289772 A1 | 12/2007 | Kuroda et al. |
| 2008/0265367 A1 * | 10/2008 | Tan ........................ H01L 24/81 257/531 |
| 2011/0006443 A1 * | 1/2011 | Noguchi ............... H01L 23/585 257/786 |

(Continued)

FOREIGN PATENT DOCUMENTS

| JP | 2005-228981 A | 8/2005 |
| WO | 2009/113372 A1 | 9/2009 |

OTHER PUBLICATIONS

Lin, et al., "An extra low-power 1Tbit/s bandwidth PLL/DLL-less eDRAM PHY using 0.3V low-swing IO for 2.5D CoWoS application", Symposium on VLSI Circuits Digest of Technical Papers, Jun. 2013, pp. C16-C17.

(Continued)

*Primary Examiner* — Mamadou Diallo
(74) *Attorney, Agent, or Firm* — Westerman, Hattori, Daniels & Adrian, LLP

(57) ABSTRACT

In accordance with the disclosed semiconductor chip and multi-chip module, signal transmission is made possible between semiconductor chips that are placed on a plane so as to be adjacent to each other through inductive coupling without affecting other coils such as in an oscillation circuit or an antenna circuit for RF communication. A multilayer solenoid coil, where a plane of the coil formed in a multilayer wiring structure in a semiconductor body is parallel to a main surface of the semiconductor body, is formed along at least one side end surface of the semiconductor body.

17 Claims, 26 Drawing Sheets

(56) References Cited

U.S. PATENT DOCUMENTS

2015/0028478 A1* 1/2015 Meyer ................ H01L 25/0655
257/738

OTHER PUBLICATIONS

Mizoguchi, et al., "A 1.2 Gb/s/pin Wireless Superconnect Based on Inductive Inter-Chip Signaling (IIS)", IEEE International Solid-State Circuits Conference (ISSCC'04), Dig. Tech. Papers, Feb. 2004, pp. 142-143 and 517.
Nikkei Electronics, Aug. 2015, pp. 56-58.
Kumagai, et al., "Advanced dicing technology for semiconductor wafer—Stealth Dicing-", International Symposium on Semiconductor Manufacturing, Sep. 2006, pp. 215-218.
Dickson, et al., "An 8×10-Gb/s Source-Synchronous I/O System Based on High-Density Silicon Carrier Interconnects", Symposium on VLSI Circuits Digest of Technical Papers, Jun. 2011, pp. 80-81.

* cited by examiner

FIG. 8A
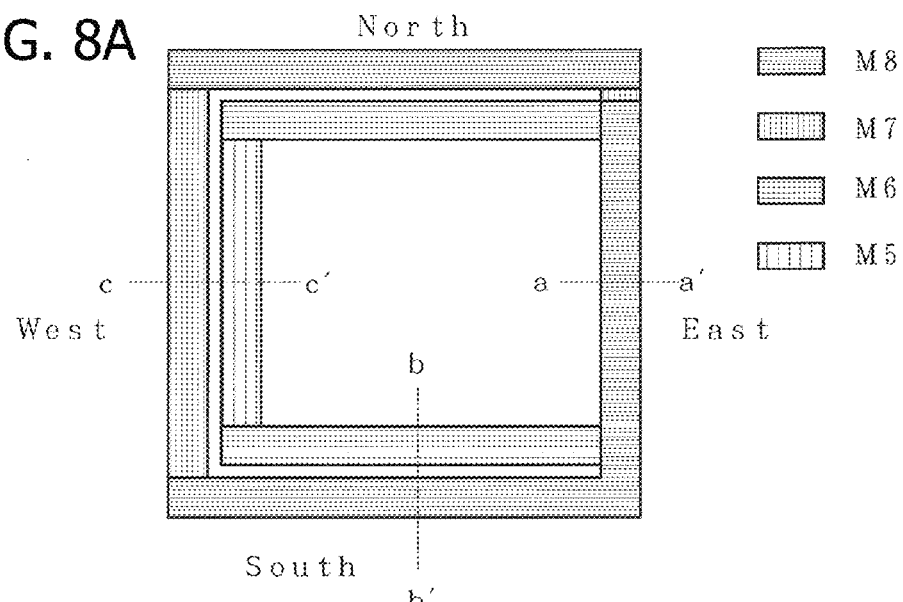
FIG. 8B
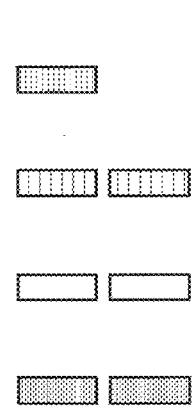
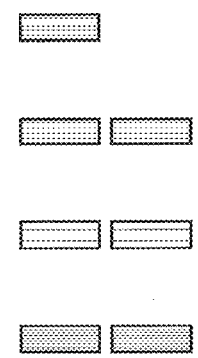
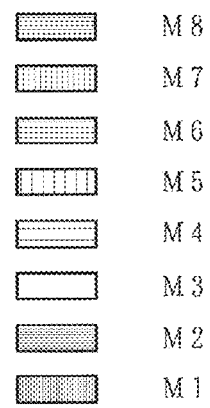

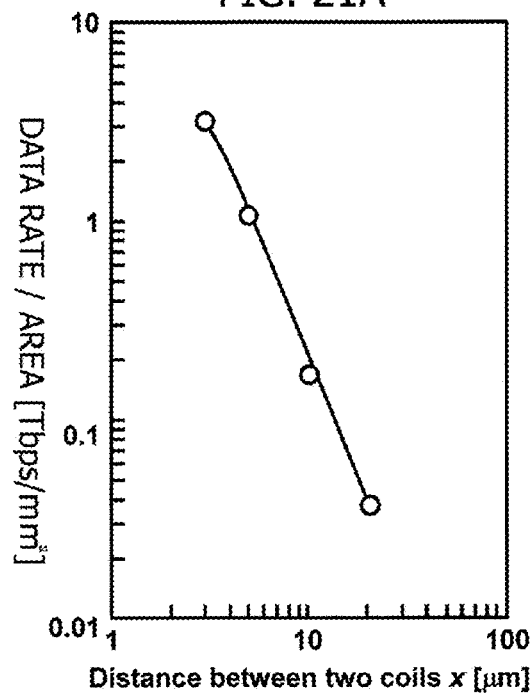
(a) Area efficiency
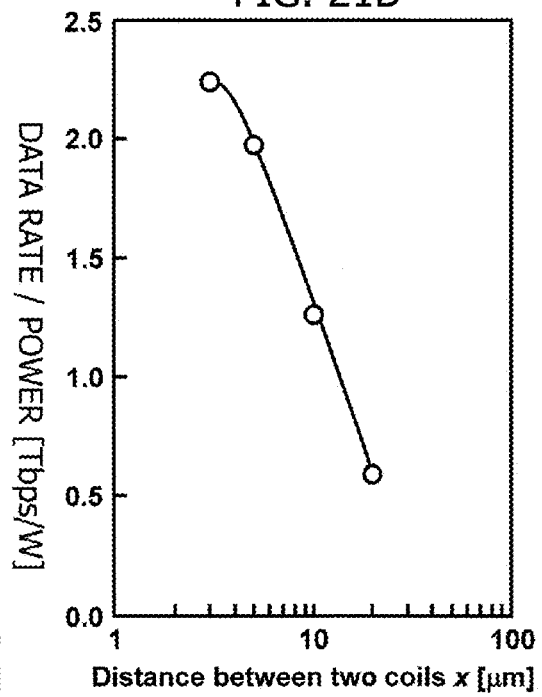
(b) Power efficiency

| | M 8 | | M 5 | | M 2 |
| | M 7 | | M 4 | | M 1 |
| | M 6 | | M 3 | | VIA |

SEMICONDUCTOR CHIP WITH MULTILAYER SOLENOID COIL AND MULTI-CHIP MODULE COMPRISING THE SAME

CROSS-REFERENCE TO RELATED APPLICATION

This application is based upon and claims the benefit of priority of the prior Japanese Patent Application No. 2015-195099, filed on Sep. 30, 2015, the entire contents of which are incorporated herein by reference.

FIELD

The present invention relates to a semiconductor chip and a multi-chip module, and for example, to a semiconductor chip and a semiconductor module where signal transmission is carried out in a noncontact manner between semiconductor chips that are arranged adjacent to each other in a plane.

BACKGROUND

In conventional multi-chip modules where a number of semiconductor chips are integrated inside one package, signal transmission is carried out between semiconductor chips mounted in a multi-chip module through connections by means of wire bonding or a silicon interposer.

FIG. 23 is a diagram illustrating a conventional structure where semiconductor chips are mounted using bonding wires. Semiconductor chips $71_1$ and $71_2$ are mounted on a package substrate 81 in such a manner that the pads $72_1$ and $72_2$ provided on the respective semiconductor chips $71_1$ and $71_2$ are connected to the pads 82 provided on the package substrate 81 via bonding wires $73_1$ and $73_2$.

In the structure where semiconductor chips are mounted using bonding wires, the mounting area and the consumed energy can be reduced, and therefore, the structure is often used for mobile devices. An issue in this mounting system is a low data transfer rate. That is to say, there is a problem such that the data transfer rate is limited by the number of bonding wires that can be connected.

Meanwhile, SiP technologies using a silicon interposer (see Non-Patent Document 1 and Non-Patent Document 2) are characterized in that the data transfer between chips can be carried out at a high rate and with low power. FIG. 24 is a diagram illustrating a conventional structure where semiconductor chips are mounted using a silicon interposer. Semiconductor chips $91_1$ and $91_2$ are flip-chip bonded on a package substrate 98 via a silicon interposer 93. The silicon interposer 93 is provided with pads 94, vias (TSVs) 95, wires 96 and C4 (controlled collapse chip connection) bumps 97.

The semiconductor chip $91_1$ and the semiconductor chip $91_2$ are connected to each other via the micro-bumps $92_1$ and $92_2$, pads 94, vias (TSVs) 95 and wires 96. In addition, the semiconductor chip $91_1$ and the semiconductor chip $91_2$ are connected to the pads 99 provided on the package substrate 98 via the pads 94, the vias (TSVs) 95 and C4 bumps 97.

In the case of SiP technologies, however, a large silicon interposer, fine micro-bumps and TSVs (through-silicon vias) are required, and an issue includes a high mounting cost.

In order to solve such a problem caused by bonding wires and a silicon interposer, methods for carrying out signal transmission in a noncontact manner using capacitances and coils have been proposed in recent years. For example, the present inventor has proposed communication between chips layered and mounted on a semiconductor chip through inductive coupling via coils formed of wires on the chip (see Patent Document 1 and Non-Patent Document 3).

In these proposals, noncontact signal transmission is made possible by allowing a signal current on which data is superposed to flow through a transmission and reception coil formed on a first semiconductor chip so that a power that has been induced in a transmission and reception coil formed on a second semiconductor chip placed above or below the first semiconductor chip can be detected.

These technologies can be used to make data transfer between a number of IC chips possible through wireless communication. As a result, neither wires for data communication nor a large interposer are necessary, and therefore, the number of wires for wire bonding can be reduced, and the number of chips that are layered on top of each other can be increased.

CITATION LIST

Patent Literature

[PATENT LITERATURE. 1] Japanese Laid-open Patent Publication No. 2005-228981
[PATENT LITERATURE. 2] International Publication Pamphlet No. WO2009-113372

Non-Patent Literature

[NON-PATENT LITERATURE. 1] T. Dickson, et al., "An 8×10-Gb/s Source-Synchronous I/O System Based on High-Density Silicon Carrier Interconnects", Symposium on VLSI Circuits, pp. 80-81, June 2011
[NON-PATENT LITERATURE. 2] M. Lin, et al., "An extra low-power 1 Tbit/s bandwidth PLL/DLL-less eDRAM PHY using 0.3V low-swing IO for 2.5 D CoWoS application", Symposium on VLSI Circuits, pp. C16-C17, June 2013
[NON-PATENT LITERATURE. 3] D. Mizoguchi et al., "A1.2 Gb/s/pin Wireless Superconnect based on Inductive Inter-chip Signaling (IIS)", IEEE International Solid-State Circuits Conference (ISSCC'04), Dig. Tech. Papers, pp. 142-143, 517, February 2004
[NON-PATENT LITERATURE. 4] Nikkei Electronics pp. 56-58 2015.08
[NON-PATENT LITERATURE. 5] M. Kumagai, et al., "Advanced dicing technology for semiconductor wafer-Stealth Dicing," International Symposium on Semiconductor Manufacturing, pp. 215-218, September 2006.

SUMMARY

Problem to Be Solved by the Invention

In accordance with these methods for carrying out signal transmission through inductive coupling, however, it is very difficult to carry out signal transmission between semiconductor chips that are placed adjacent to each other in a plane as illustrated in FIGS. 23 and 24. That is to say, a problem arises in a case where signal transmission is carried out between semiconductor chips that are placed adjacent to each other in a plane such that the direction of the magnetic flux generated in a transmission and reception coil is approximately perpendicular to the plane of the coil, and therefore, the direction of the generated magnetic flux is perpendicular to the direction of the signal transmission, and thus, the generated magnetic flux cannot be effectively used.

Therefore, the present inventor carried out a simulation on a plane spiral coil. FIG. 25 is a plan diagram illustrating a plane spiral coil used for the simulation, where the outermost block side is 70 μm and the number of times wound n is 8. In the case where the communication distance d is the shortest possible distance 3 μm according to the most current dicing technology, that is to say, in the case of d=3 μm, the coupling coefficient k is 0.0733, and the mutual inductance M which indicates the intensity of the coupling is 0.39 nH. In order to make communication possible, the mutual inductance M needs to be approximately 1 nH, and therefore, it has become clear from the results that it is effectively impossible to carry out signal transmission using a plane spiral coil of which the outermost block side is approximately 70 μm.

In order to carry out signal transmission without fail, very large transmission and reception coils are necessary. In the case where large transmission and reception coils are provided, however, the area occupied by the transmission and reception coils increase, which makes miniaturization of the semiconductor chip difficult. In addition, a problem arises such that the magnetic flux generated by a transmission and reception coil for signal transmission between chips may affect another coil that is provided in an antenna circuit within the semiconductor chip for an oscillation circuit or RF communication. This problem can bring about deterioration in the properties or a worsening of the chip margins.

In order to solve these problems, it has been proposed to provide in proximity to a side end surface of a semiconductor chip a transmission and reception coil of which the coil plane is approximately perpendicular to the main surface of the semiconductor chip (see Patent Document 2 or Non-Patent Document 4).

As a result of the simulations carried out in the above-described proposals, however, it has become clear that stable signal transmission without fail is difficult. FIG. 26 is a schematic perspective diagram illustrating a coil formed in a multilayer wiring structure used for a simulation, where the length of the sides in the bottom layer and in the top layer is 70 μm, the length of the longitudinal sides that correspond to the vias is 3 μm, and the number of times wound is 8. In the case where the communication distance is d=3 μm as well, the coupling coefficient is 0.124 and the mutual inductance M is 0.13 nH, which means the mutual inductance M is approximately ⅓ of that in plane spiral coils.

As a result of another simulation, in a case where the facing semiconductor chips were shifted by approximately 5 μm in the direction of the height, the coupling coefficient was 0.01 and the mutual inductance M was 0.01 nH, and thus, it was found that the properties lowered by one or more digits as compared to a case where there was no positional shifting in the direction of the height. That is to say, the shape of the coil in this case was very oblong in the plane of the coil, such as 70 μm×3 μm, due to the restriction of the sides in the longitudinal direction by the thickness of the multilayer wiring structure in the direction in which the layers were layered. In the case where positional shifting occurs in the direction of the height during the mounting process in this coil, a current that flows through the bottom side and a current that flows through the top side are oriented in the opposite directions, and therefore, the magnetic fields generated by the currents are offset on the reception side. Accordingly, stable signal transmission without failure is difficult in the case where a coil having such a structure is used.

According to an aspect of the embodiments,
a semiconductor chip, including:
    a semiconductor body; and
    a multilayer solenoid coil, where a plane of the coil formed in a multilayer wiring structure in the semiconductor body is parallel to a main surface of the semiconductor body, characterized in that
    the multilayer solenoid coil is formed along at least one side end surface of the semiconductor body.

Another aspect of the disclosure provides a multi-chip module with: a mounting substrate; a first semiconductor chip mounted on the mounting substrate; and a second semiconductor chip mounted on the mounting substrate, and the multi-chip module is characterized in that the first semiconductor chip has a multilayer solenoid coil, where the plane of the coil formed along at least a first side end surface of a first semiconductor body is parallel to the main plane of the first semiconductor body, the second semiconductor chip has a multilayer solenoid coil, where the plane of the coil formed along at least a first side end surface of a second semiconductor body is parallel to the main plane of the second semiconductor body, and the multilayer solenoid coil provided in the first semiconductor chip and the multilayer solenoid coil provided in the second semiconductor chip face each other.

Effects of the Invention

In accordance with the disclosed semiconductor chip and multi-chip module, signal transmission is made possible between semiconductor chips that are placed on a plane so as to be adjacent to each other through inductive coupling without affecting other coils such as in an oscillation circuit or an antenna circuit for RF communication.

BRIEF DESCRIPTION OF DRAWINGS

FIGS. 8A and 8B are diagrams illustrating the layered structured of a multilayer solenoid coil used in the semiconductor chip according to Example 2 of the present invention;

FIGS. 21A and 21B are graphs illustrating the area efficiency and the power efficiency of the data transfer;

DESCRIPTION OF EMBODIMENTS

Figure 1A:
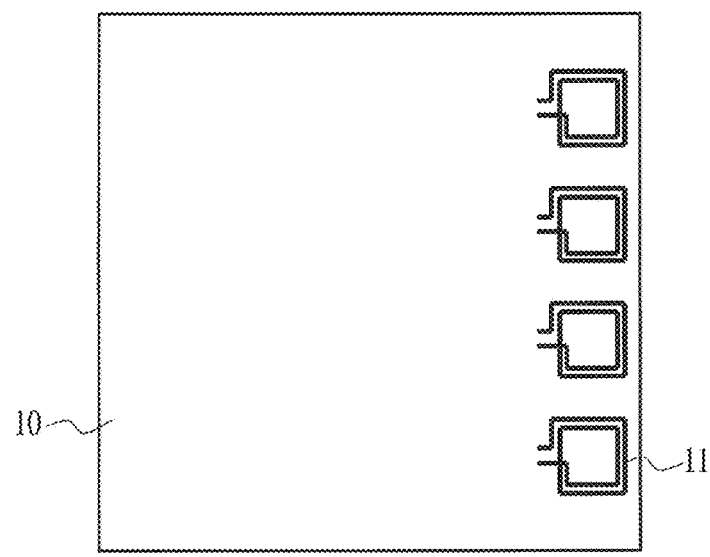
FIGS. 1A and 1B are schematic diagrams illustrating the configuration of a semiconductor chip and a multi-chip module according to an embodiment of the present invention.

Here, an embodiment of the present invention is described in reference to FIGS. 1A through 2B. FIGS. 1A and 1B are schematic diagrams illustrating the configurations of a semiconductor chip and a multi-chip module according to the embodiment of the present invention. FIG. 1A is a schematic diagram illustrating the configuration of the semiconductor chip, and FIG. 1B is a schematic diagram illustrating the configuration of the multi-chip module. As illustrated in FIG. 1A, the semiconductor chip 10 according to the embodiment of the present invention is provided with a multilayer solenoid coil 11, where the plane of the coil is parallel to the main plane of the semiconductor body, which is formed in a multilayer wiring structure in a semiconductor body. The multilayer solenoid coil 11 is formed along at least one side end surface of the semiconductor body. In this case, it is desirable for the multilayer solenoid coil 11 to be provided within a range of 7 μm from the side end surface of the semiconductor body. Here, the semiconductor body means a semiconductor substrate, a semiconductor substrate in which an epitaxial layer has been formed, an epitaxial layer from which the semiconductor substrate has been removed, or the like.

Figure 1B:
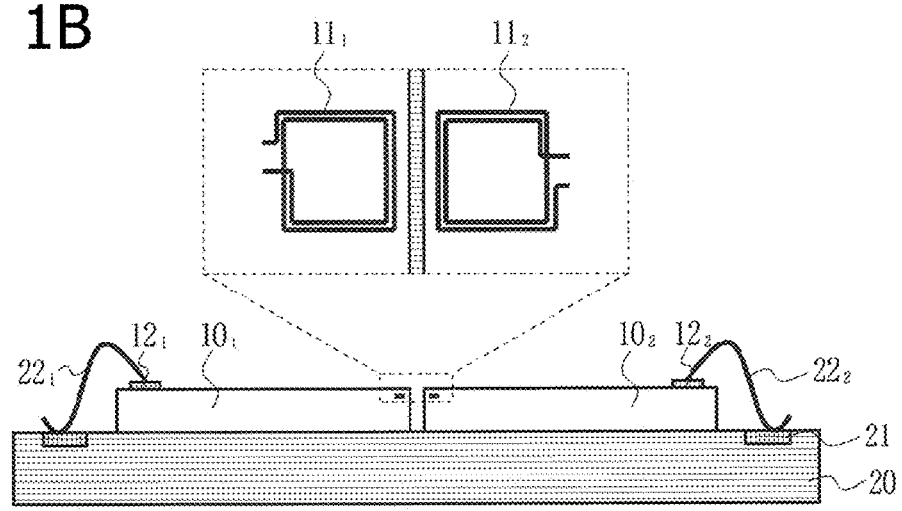

As illustrated in FIG. 1B, in the multi-chip module according to the embodiment of the present invention, a first semiconductor chip $10_1$ having a multilayer solenoid coil $11_1$ formed along at least a first side end surface of the semiconductor body and a second semiconductor chip $10_2$ having a multilayer solenoid coil $11_2$ formed along at least the first side end surface of the semiconductor body are mounted on a mounting substrate 20 and are connected to the mounting substrate 20 by bonding wires $22_1$ and $21_2$ electrically. At this time, the multilayer solenoid coil $11_1$ provided in the first semiconductor chip $10_1$ and the multilayer solenoid coil $11_2$ provided in the second semiconductor chip $10_2$ are arranged so as to face each other.

As a result of the above-described simulation of the coils where the multilayer solenoid coils $11_1$ and $11_2$ were arranged along side end surfaces of the semiconductor bodies $10_1$ and $10_2$, that is to say, in proximity to the dicing lines, it was found that transmission and reception are possible between the chips through inductive coupling. In conventional manufacturing processes for semiconductor devices, it is practically impossible to provide multilayer solenoid coils $11_1$ and $11_2$ in proximity to a dicing line due to poor dicing precision.

An improvement in technology in recent years, however, has made dicing possible with high precision. For example, laser ablation can be used for dicing without causing any cracks (see Non-Patent Document 5), and thus, a multilayer solenoid coil provided in proximity to a dicing line is not broken in a dicing process, which makes it possible to place a metal wire at a distance of 1 μm from the chip end. Current mass production technology also makes it possible to die bond two semiconductor chips $10_1$ and $10_2$ that are at a distance of 1 μm from each other, and therefore, the distance x between the coils can be made x≥3 μm. Thus, the present inventor drastically changed his way of thinking and realized a way of providing multilayer solenoid coils in proximity to dicing lines, which had been considered to be practically impossible according to the prior art.

Figure 2A:
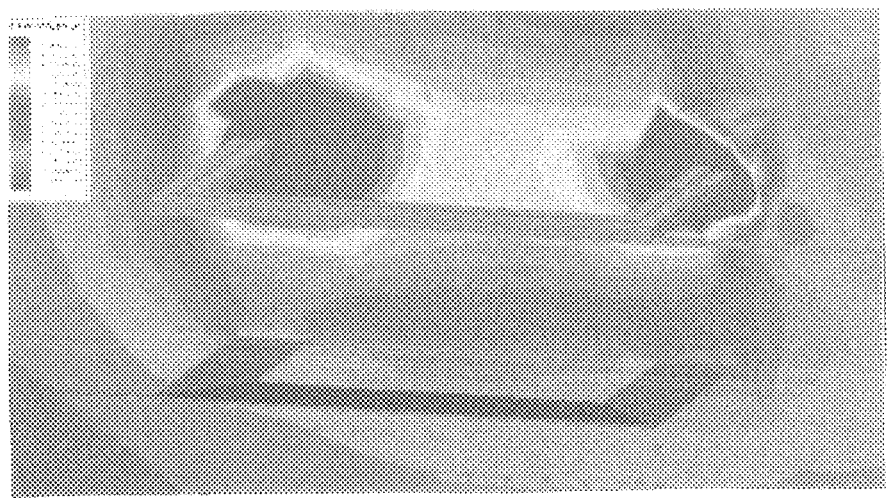
FIGS. 2A and 2B are diagrams illustrating the results of an electrical field simulation.
Figure 2B:
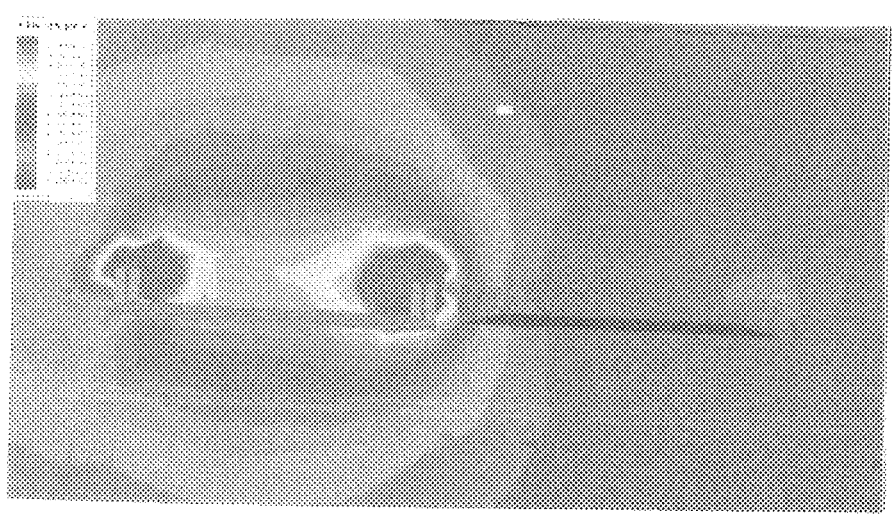

FIGS. 2A and 2B are diagrams illustrating the results of an electrical field simulation. FIG. 2A is a diagram illustrating a state of magnetic field coupling in the vertical direction in a case where conventional semiconductor chips are layered on top of each other, where magnetic field coupling was confirmed between upper and lower coils. Meanwhile, as illustrated in FIG. 2B, it was found that magnetic field coupling takes places between sides of semiconductor chips that face each other in a case where the semiconductor chips are placed adjacent to each other in a horizontal direction.

A hollow square coil made of a multilayer wire wound in a semiconductor chip generates a magnetic field around its four sides. In the case where coils overlap in the vertical direction, as illustrated in FIG. 2A, magnetic field coupling takes place between each pair of the four sides. In the case where coils are adjacent to each other in a horizontal direction, as illustrated in FIG. 2B, magnetic field coupling takes place between a pair of sides that face each other.

In the case where coils are adjacent to each other in a horizontal direction, the mutual inductance M is approximately as small as ¼ as compared to the case where the coils overlap in the vertical direction. However, it is possible to compensate for the shortage of M by increasing the number of winding or devising a different way of winding. As illustrated in Non-Patent Document 4, it was found that coupling in a horizontal direction can be made strong to such a degree as to be used in spite of the fact that only coupling in the vertical direction can be considered to be strong enough.

Thus, the present inventor has devised a way of winding a coil with which the mutual inductance M can be increased. The mutual inductance M increases in proportion to the number (n) of windings of the coil to the power of approximately 1.7, and therefore, such a conclusion is gained that the solenoid coil is provided with winding in the direction in which the layers are layered, and in addition has a spiral in the direction of a plane if necessary so that the number of windings can be increased. That is to say, the intensity of the received signal is determined by the product of the change in the current through the transmission coil (dI/dt) and the mutual inductance M, and therefore, the intensity of the received signal can be increased by increasing the mutual inductance M by devising the way in which the coil is wound.

In the case where the coil has a spiral, the sides that face each other in each coil are at a distance away from each other, and therefore, the width of the coil wire is narrower along the sides at which two coils face each other so that an increase in the communication distance can be suppressed. The other three sides in each coil barely affect the mutual inductance M, and therefore, the wire width is made thick so that the parasitic resistance in the entire coil can be kept low. In addition, all the wire resources are used up along the sides of the semiconductor chips that face each other because there are no wires other than those of the coils at an end of the semiconductor chips. Wire resources that may be necessary for a power line or a signal wire to cross may be kept along the other three sides of each semiconductor chip.

As a result of the simulation, sufficient data communication is possible in the case where the mutual inductance is approximately 1 nH, communication is possible in the case where the distance d between coils in a horizontal direction is approximately 1/12 of the diameter of the coil, and communication is possible even in the case where the coils shift by approximately 1/10 of the diameter of the coils in a lateral direction, and therefore, communication is possible for square coils having sides of 80 µm in the case where the distance in a horizontal direction is approximately 7 µm. As described below, communication is possible judging from another simulation in the case where the distance between the sides of a coil that face the sides of another coil and the side end surface of the semiconductor chip is within 9.5 µm.

In recent years, lasers have been used for dicing without causing any cracks, and it has been reported that metal wires can be placed at 1 µm from an end of a chip (see Non-Patent Document 3). It is also possible to die bond two semiconductor chips at a distance of 1 µm to 3 µm away from each other. Accordingly, chips can be mounted so that the lateral distance between multilayer solenoid coils is within 5 µm, and therefore, no problems arose with the setting conditions in this simulation.

As described below, the data transfer rate per unit area was 3.2 Tb/s/mm$^2$ in a simulation in accordance with a 65 nm-CMOS technology where D=40 µm and d=3 µm. In addition, the power consumption per unit data transfer rate (power efficiency (Tb/s/W=(pJ/b))) could be increased greatly by setting the coil distance d at 3 µm to 5 µm. Incidentally, the power efficiency per unit data transfer rate was 2.3 Tb/s/W (=0.43 (pJ/b)) in a simulation in accordance with a 65 nm-CMOS technology where D=40 µm and d=3 µm.

In the case of the above-described plane spiral coil, the facing sides are placed more inward inside the coil as the coil winds in such a manner that the distance between the sides become greater, and therefore, a large mutual inductance cannot be gained. Meanwhile, in the case of the present invention, the distance between the sides that face each other is the same for a coil of the same number of windings, and therefore, the mutual inductance M ideally increases in proportion to n to the power of 1.7 (n to the power of 1.6 to n to the power of 1.8) as the number n of windings increases as described above. Incidentally, the coupling coefficient was 0.184 and the mutual inductance M was 1.16 nH for the communication distance d=3 µm in the case where the sides of a multilayer solenoid coil that was wound eight times was 70 µm, and thus, a great improvement was realized as compared to the horizontal spiral coils or the coil in Patent Document 1.

In the case where the coils shifted from each other by 5 µm in the direction of the height, the coupling coefficient was 0.112 and the mutual inductance was 0.71 nH, and thus, a great decrease of one digit or more as in the coil in Patent Document 2 was not observed, though there was a slight decline in the values. Therefore, multilayer solenoid coils are used in the embodiments of the present invention, and thus, magnetic field coupling has a sufficient intensity even if the direction is not horizontal. Accordingly, the restriction in the direction of the height is small during the mounting process, which is barely different from the prior art in the difficulty of mounting chips.

In addition, it is desirable for the sides of a multilayer solenoid coil in the respective layers on the side end surface side to be aligned in the direction in which the layers are layered in the multilayer solenoid coil. This structure can keep the distance constant between all the sides that face each other.

It is also desirable for the width of the sides of a multilayer solenoid coil in the respective layers on the side end surface side to be narrower than the width of the other sides. In order to increase the mutual inductance M, the wire width of the sides that face each other between the chips that face each other should be made narrower so that the distance between the sides that face each other does not increase much. When the wire width is narrow, however, the parasitic resistance increases, which makes it difficult for a large current to flow through the transmission coil, and thus, changes in the transmission current becomes small or the bandwidth of the reception coil becomes narrower, which makes high speed communication impossible. Meanwhile, the sides that are orthogonal to the sides that face each other between chips do not greatly affect the mutual inductance M between the sides that face each other between chips. Furthermore, the sides facing the sides that face another chip in the same coil do not greatly affect the mutual inductance M, even in the case they become thicker in the direction away from the sides that face another chip. Accordingly, it is possible to increase the mutual inductance M without increasing the resistance value of the entirety of the coil by making the wire width of the sides that face each other between chips that face each other narrower and by making the wire width of the other sides thicker.

It is also desirable for the wire density along the side of a multilayer solenoid coil on the side end surface side to be higher than the wire density along the other three sides. The mutual inductance M can be increased by making the wire density along the side of a multilayer solenoid coil on the side end surface side higher than the wire density along the other three sides. In addition, it is possible to provide at least a power line or a signal wire in such a manner that the wire passes through a low wire density area along the sides thereof.

An example of the way of such winding can be cited where the odd-numbered wound coil elements of a multilayer solenoid coil are formed of first wire elements located outside, and the even-numbered wound coil elements of the multilayer solenoid coil are formed of first wire elements located along the side end surface and second wire elements located inside the first wire elements.

Furthermore, the multilayer solenoid coil may have in its inside an inner multilayer solenoid coil wound with wires that shares the multilayer structure with the winding wires of the multilayer solenoid coil, where the multilayer solenoid coil and the inner multilayer solenoid coil are electrically connected in series. The mutual inductance can be increased by approximately three times by incorporating an inner multilayer solenoid coil in this manner. As a result, the communication distance can be increased and the distance between chips can be expanded. Alternatively, communication is made possible with less power and less energy.

The multilayer solenoid coil may be one of the multilayer solenoid coils for reception or one of the multilayer solenoid coils for transmission that are aligned in a lateral direction. The multilayer solenoid coil may be a multilayer solenoid coil made of a multilayer solenoid coil for reception and a multilayer solenoid coil for transmission layered on top of each other in the same location. In the case of a multilayer wiring structure, in general, the higher the layer is, the thicker the film thickness of the wiring layer is. Accordingly, multilayer solenoid coils for transmission through which a large current flows are wound with thick wires in upper layers, and multilayer solenoid coils for reception through which a current that is not very large flows are wound with thin wires in lower layers. In such a case, the locations of a multilayer solenoid coil for transmission and a multilayer solenoid coil for reception may differ in the direction of the height between semiconductor chips that face each other, which makes the communication distance slightly greater than the distance between the chips. However, as is clear from the above-described simulation results, no problems arise.

Alternatively, one semiconductor chip may have a multilayer in the order of a multilayer solenoid coil for transmission/a multilayer solenoid coil for reception, and the other semiconductor chip may have a multilayer in the order of a multilayer solenoid coil for reception/a multilayer solenoid coil for transmission. In such a case, the locations of a multilayer solenoid coil for transmission and a multilayer solenoid coil for reception are almost the same in the direction of the height between semiconductor chips that face each other, which makes the communication distance shorter.

Furthermore, multilayer solenoid coils may be provided along at least two side end surfaces of the semiconductor body. In this case, communication is made possible through magnetic field coupling in an arrangement where two or more semiconductor chips face one semiconductor chip.

Moreover, the first semiconductor chip that is provided with a multilayer solenoid coil, where the plane of the coil formed along at least a first side end surface of a first semiconductor body is parallel to the main plane of the first semiconductor body, and the second semiconductor chip that is provided with a multilayer solenoid coil, where the plane of the coil formed along at least a first side end surface of a second semiconductor body is parallel to the main plane of the second semiconductor body can be mounted on a mounting substrate in such a manner that the multilayer solenoid coil provided in the first semiconductor chip and the multilayer solenoid coil provided in the second semiconductor chip face each other, and thus, a multi-chip module for mutual communication through magnetic field coupling can be realized.

In this case, it is desirable for one side of the multilayer solenoid coil provided in the first semiconductor chip and one side of the multilayer solenoid coil provided in the second semiconductor chip to face each other at a distance of 7 µm or less, preferably 5 µm or less, in order for communication to be stable between small multilayer solenoid coils.

In addition, it is desirable for the center point of the multilayer solenoid coil provided in the first semiconductor chip in the direction in which the layers are layered to be the same as the center point of the multilayer solenoid coil provided in the second semiconductor chip in the direction in which the layers are layered in order for communication to be stable with a small current.

Here, in the case where the center point of the multilayer solenoid coil provided in the first semiconductor chip in the direction in which the layers are layered is shifted from the center point of the multilayer solenoid coil provided in the second semiconductor chip in the direction in which the layers are layered by 5 µm or less, stable communication is possible.

In addition, a magnetic field coupling type multi-chip module in which three or more semiconductor chips are mounted can be implemented by providing the same multilayer solenoid coil as that provided in the first semiconductor chip along the second side end surface of the first semiconductor body and mounting on a mounting substrate a third semiconductor chip having a multilayer solenoid coil of which the coil plane formed along at least the first side end surface of a third semiconductor body is parallel to the main surface of the third semiconductor body in such a manner that the multilayer solenoid coil faces the multilayer solenoid coil provided along the second side end surface.

According to the embodiment of the present invention, the connection system can be switched from the mechanical type using bonding wires to an electronic type using multilayer solenoid coils in order to realize a reduction in cost, an increase in speed, and a reduction in energy consumption. In addition, the magnetic field communication technology provides AC connections, and therefore, different types of chips where the power supply voltages are different can be easily connected to each other. For example, it is possible to easily connect a CPU or an FPGA manufactured in a cutting-edge process to an MPU or an I/O chip manufactured in an older generation process in order to save on the IP license fee. Incidentally, in a simulation using parameters for a 65 nm-CMOS technology, the communication rate was 3.2 Tb/s/mm$^2$ and the power consumption was 0.4 pJ/b.

In addition, the intensity of the reception signal is determined by the product of the change in the current in the transmission coil (dI/dt) and the mutual inductance M, and the intensity of the reception signal can be increased by increasing dI/dt by devising the transmission circuit. In the case where the length (D) of one side of a coil is 40 µm and the distance (x) between the two coils is 3 µm, for example, data communication of 9 Gb/s/coil is possible at the maximum (4.65 Tb/s/mm$^2$). This can be compared to a case of communication (333 Gb/s/mm$^2$) at 10 Gb/s/link using four C4 bumps with a pitch of 50 µm per lane (shielded by means of a differential signal and VDD/GND) so as to find the transfer rate per chip unit area that is 14 times higher.

In addition, the magnetic field is generated uniformly along and 360 degrees around the sides of a coil, and therefore, data can be transferred as long as the distance between the lines is small even in the case where the height is not the same between the two coils, that is to say, between the semiconductor chips. Semiconductor chips can be mounted at a height with a precision of +/−1.5 µm by using Cu pillars as micro-bumps, and therefore, the distance between lines can be made approximately 4 µm. In this case, no silicon interposer, no micro-bumps or no TSVs are necessary, and there are almost no additional mounting costs. Thus, the connection system can be switched from the mechanical type to the electronic type so as to pursue an increase in the rate and a decrease in the power by taking advantage of the technological progresses in wafer processing.

Example 1

Figure 3:
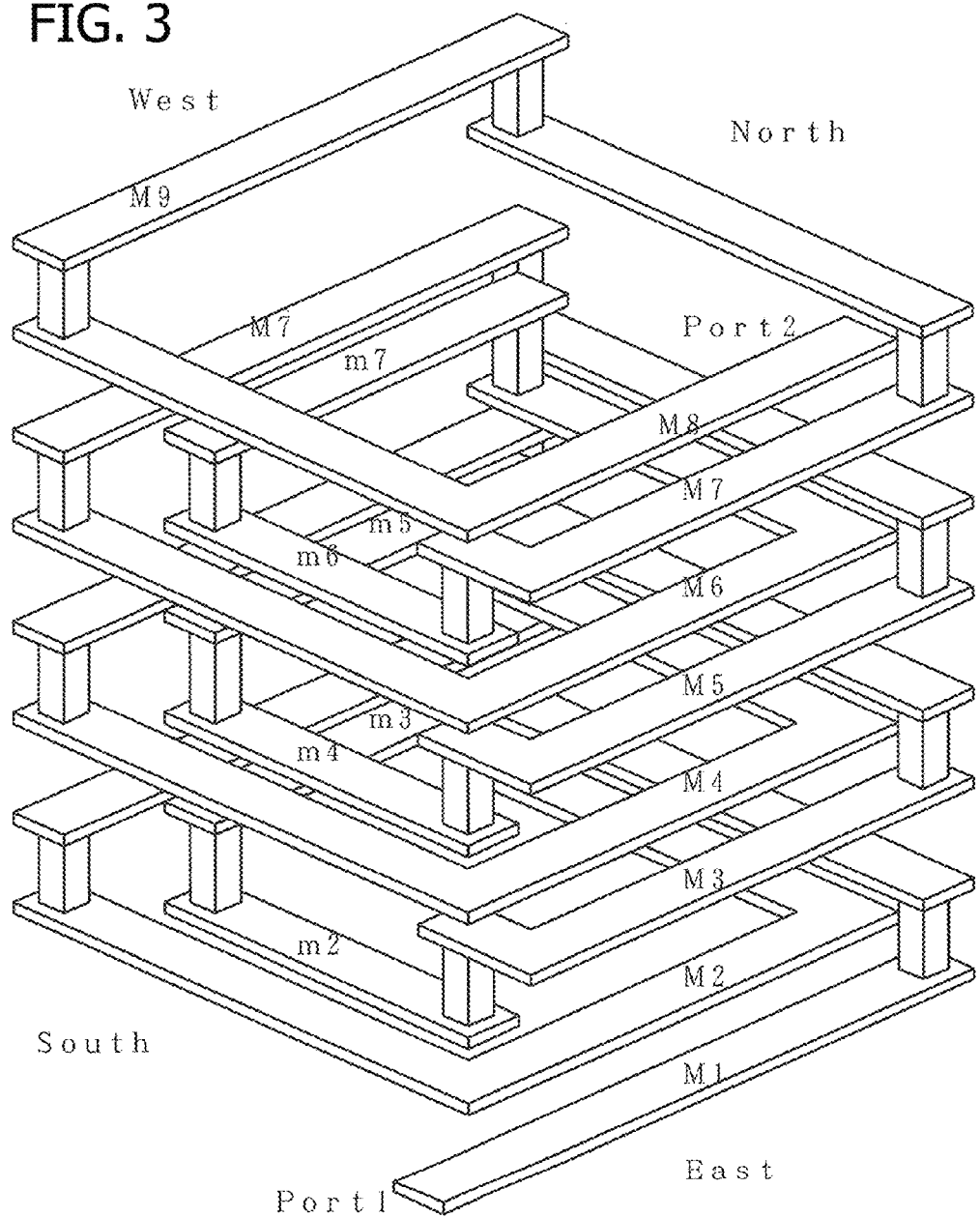
FIG. 3 is a schematic perspective diagram illustrating a multilayer solenoid coil provided in the semiconductor chip according to Example 1 of the present invention.

Next, the semiconductor chip according to Example 1 of the present invention is described in reference to FIGS. 3 through 7C. FIG. 3 is a schematic perspective diagram showing a multilayer solenoid coil provided in the semiconductor chip according to Example 1 of the present invention, where the multilayer solenoid coil is formed in a multilayer wire structure having nine layers. In addition, the sides that face the multilayer solenoid coil provided in another semiconductor chip are the east side for the purpose of convenience, and the other sides are the north side, the west side, and the south side in this order.

The way in which this multilayer solenoid coil is wound can be expressed as follows in the order of east, north, west and south. Here, M denotes a metal line with a suffix representing the layer level of the wire.

M8 (Port)
M7M8M9M8 ($7^{th}$ winding)
M6M6M7M6 ($6^{th}$ winding)
M5M6M7M6 ($5^{th}$ winding)
M4M4M5M4 ($4^{th}$ winding)
M3M4M5M4 ($3^{rd}$ winding)
M2M2M3M2 ($2^{nd}$ winding)
M1M2M3M2 ($1^{st}$ winding)

Here, the outer wires are denoted by M and the inner wires are denoted by m, the plugs are denoted by ↑ and ↓, and the connections at the same layer level are denoted by — in order to make it easier to understand the way the coil is wound. In addition, the wires on the east side in the odd-numbered windings excluding the first winding are denoted by 'M. Thus, the following expression is gained.

—M8
↑'M7↑M8↑M9↓M8
 M6—m6↑m7↓m6
↑'M5↑M6↑M7↑M6
 M4—m4↑m5↓m4
↑M3↑M4↑M5↓M4
 M2—m2↑m3↓m2
 M1↑M2↑M3↓M2

Accordingly, the north, west and south sides are outer wires at the odd-numbered windings and inner wires at the even-numbered windings.

Figure 4A:
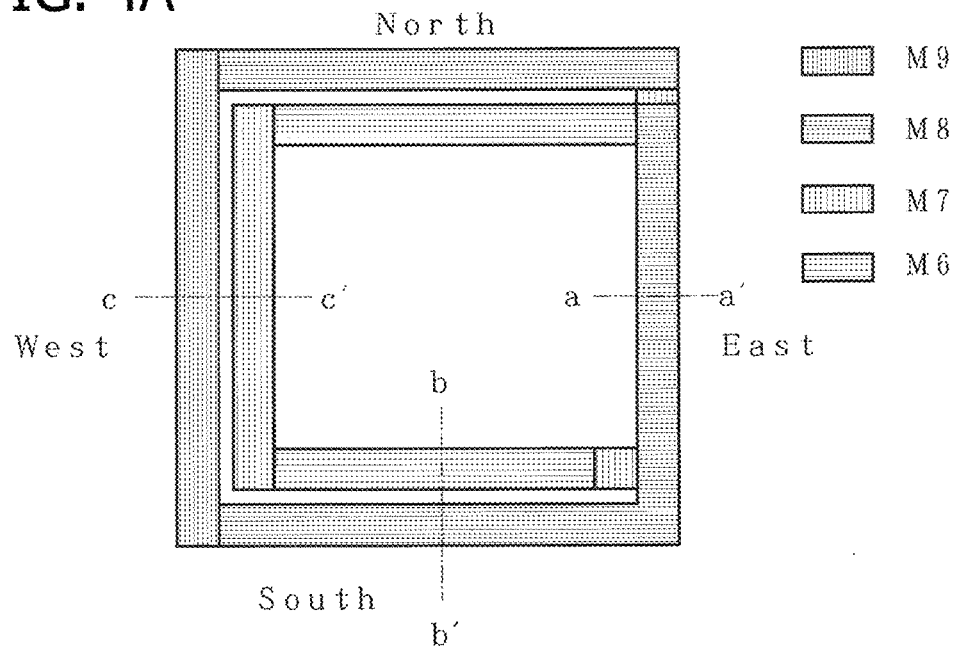
FIGS. 4A and 4B are diagrams illustrating the layered structure of a multilayer solenoid coil.
Figure 4B:
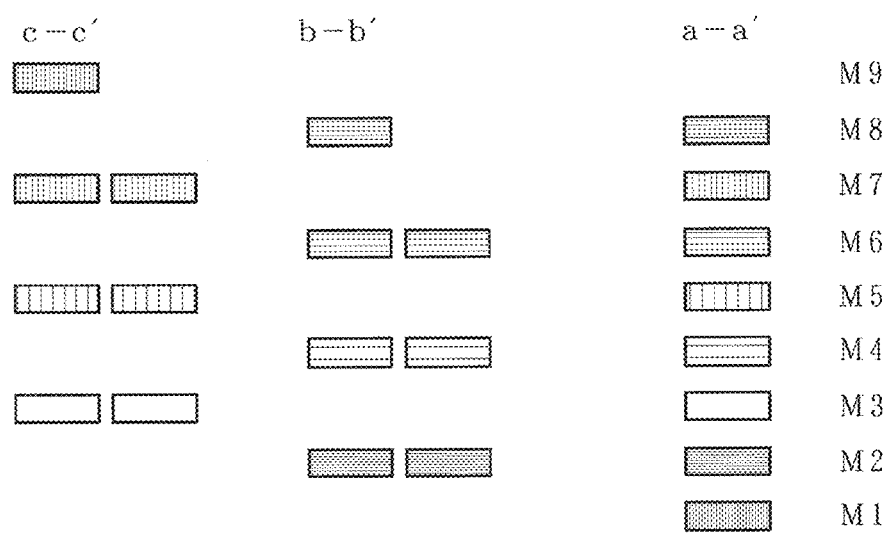

FIGS. 4A and 4B are diagrams illustrating the layer structure of a multilayer solenoid coil. FIG. 4A is a plan diagram and 4B is a cross-sectional diagram along the chain lines a-a', b-b' and c-c' in FIG. 4A. As is clear from FIG. 4B, all the seven layers have an east side, and the east sides are aligned as viewed in the direction in which the layers are layered. Only the even-numbered layers or only the odd-numbered layers have the other sides, north, west and south, so that the power lines and the signal wires can traverse three-dimensionally. Thus, the wire concentration is the highest along the east side that faces the multilayer solenoid coil provided in another semiconductor chip, and therefore, the coupling coefficient and the mutual inductance M can be increased as compared to plane spiral coils.

Figure 5:
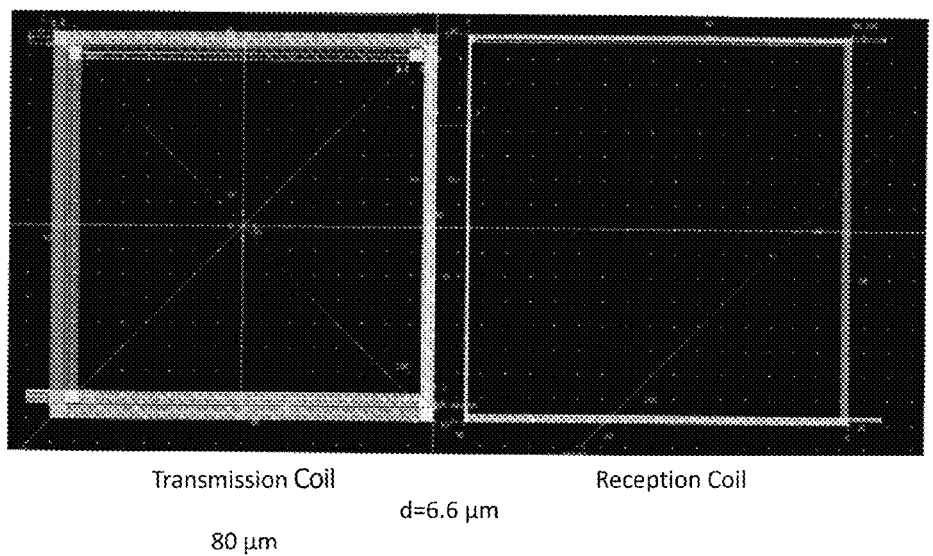
FIG. 5 is a diagram illustrating the transmission and reception coils used for a simulation.

FIG. 5 is a diagram illustrating the transmission and reception coils used in a simulation where the transmission and reception coils are eight winding square coils having sides of 80 µm with the distance between the coils being 6.6 µm. Other values are set as follows.

Transmission coil: wire width of 2.5 µm, wire intervals of 0.5 µm
Reception coil: wire width of 0.6 µm, wire intervals of 0.3 µm
Thickness of multilayer wires:
Thickness of M8 at 0.9 µm
Thickness of the layer between M8 and M7: 0.595 µm
Thickness of M7, M6, M5, M4, M3 and M2: 0.22 µm
Thickness of interlayer insulating films between M7 and M6, between M6 and M5, between M5 and M4, between M4 and M3, and between M3 and M2: 0.175 µm
Thickness of M1: 0.18 µm
Thickness of the layer between M1 and the surface of the substrate: 0.29 µm
Height of M8 from M1: 3.83 µm Here, a small amount of current flows through the reception coil for which a fine wire is used, though the figure shows the same width as that of the transmission coil.

As a result of the simulation, the coupling coefficient was 0.096 and the mutual inductance M was 0.91 nH. Accordingly, square coils having sides of 80 µm can make communication possible when the coil distance is 6.6 µm.

Figure 6:
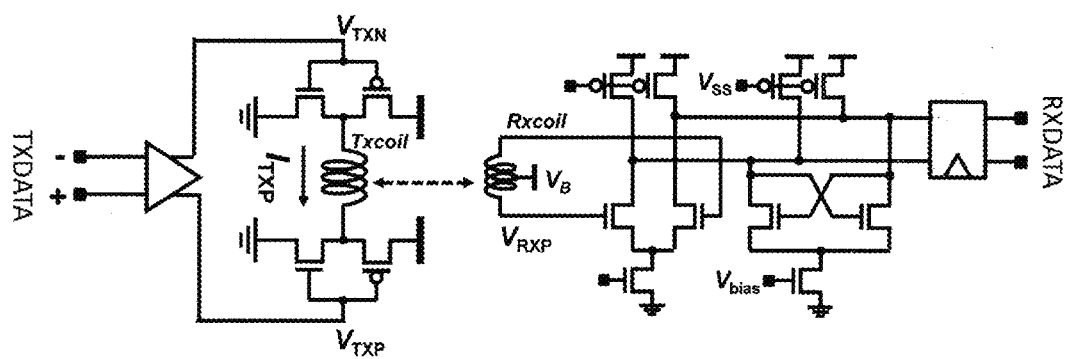
FIG. 6 is a diagram illustrating transmission and reception circuits.

FIG. 6 is a diagram illustrating a transmission and a reception circuit, where the left side is a transmission circuit and the right side is a reception circuit. Here, the transmission and reception circuits are manufactured in a 0.18 µm CMOS process. A PRBS$2^7$-1 signal of 2 Gb/s/link was used for the communication experiment.

Figure 7A:
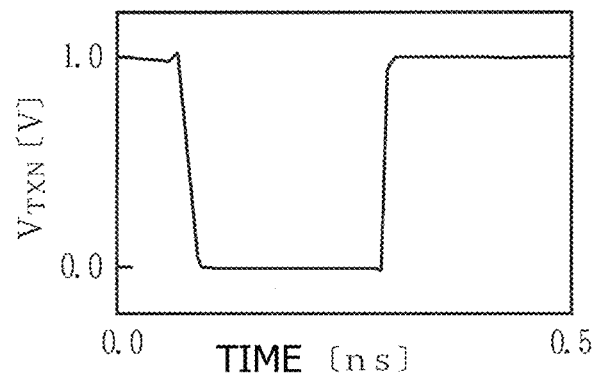
FIGS. 7A through 7C are diagrams illustrating signal wave forms.
Figure 7B:
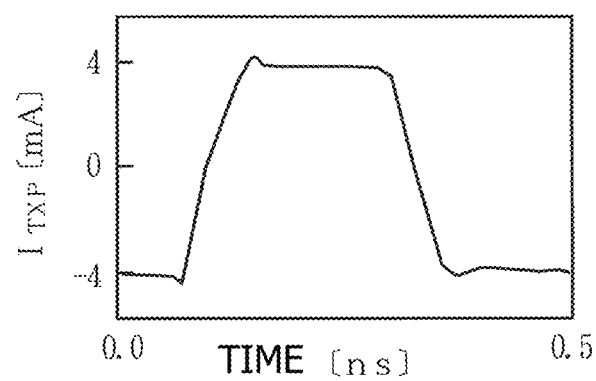
Figure 7C:
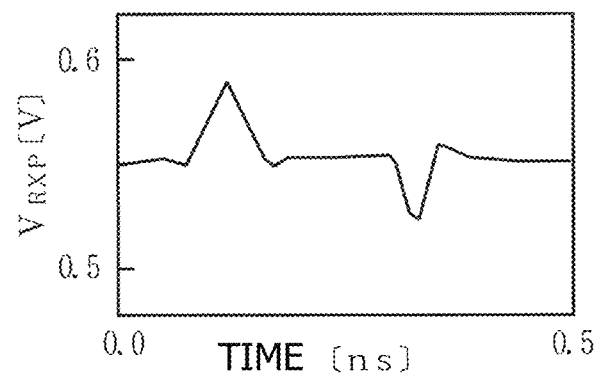

FIGS. 7A through 7C are diagrams illustrating signal waveforms. When a voltage $V_{TXN}$ having the waveform in FIG. 7A is applied, the current $I_{TXP}$ in FIG. 7B flows through the transmission coil so as to generate a magnetic field. This magnetic field allows the reception coil to generate a voltage of $V_{RXP}$ as a signal. As a result, communication is possible when the distance d in the horizontal direction is up to approximately ¹⁄₁₂ the diameter of the coils, and it was confirmed that communication was possible even when the coils are shifted in the lateral direction by approximately ¹⁄₁₀ the diameter of the coils. Here, FIG. 7C illustrates the voltage generated in the reception coil.

Example 2

Next, a multilayer solenoid coil used in the semiconductor chip according to Example 2 of the present invention is described. The way in which this multilayer solenoid coil is wound can be expressed as follows in the order of east, north, west and south.

M8 (Port)
↑'M7↑M8↓M7↑M8
 M6—m6↓m5↑m6
↑'M5↑M6↓M5↑M6
 M4—m4↓m3↑m4
↑'M3↑M4↓M3↑M4
 M2—m2↓m↑m2
 M1↑M2↓M1↑M2

In this case as well, the north, west and south sides are inner wires at the odd-numbered windings.

FIGS. 8A and 8B are diagrams illustrating the layer structure of a multilayer solenoid coil used in the semiconductor chip according to Example 2 of the present invention. FIG. 8A is a plan diagram, and FIG. 8B is a cross-sectional diagram along chain lines a-a', b-b' and c-c' in FIG. 8A. As is clear from FIG. 8B, all the seven layers have an east side, and the east sides are aligned as viewed in the direction in which the layers are layered. Only the even-numbered layers or only the odd-numbered layers have the other sides, north, west and south, so that the power lines and the signal wires can traverse three-dimensionally. Thus, in Example 2 of the present invention as well, the wire concentration is the highest along the east side that faces the multilayer solenoid coil provided in another semiconductor chip, and therefore, the coupling coefficient and the mutual inductance M can be increased as compared to plane spiral coils.

Example 3

Figure 9A:
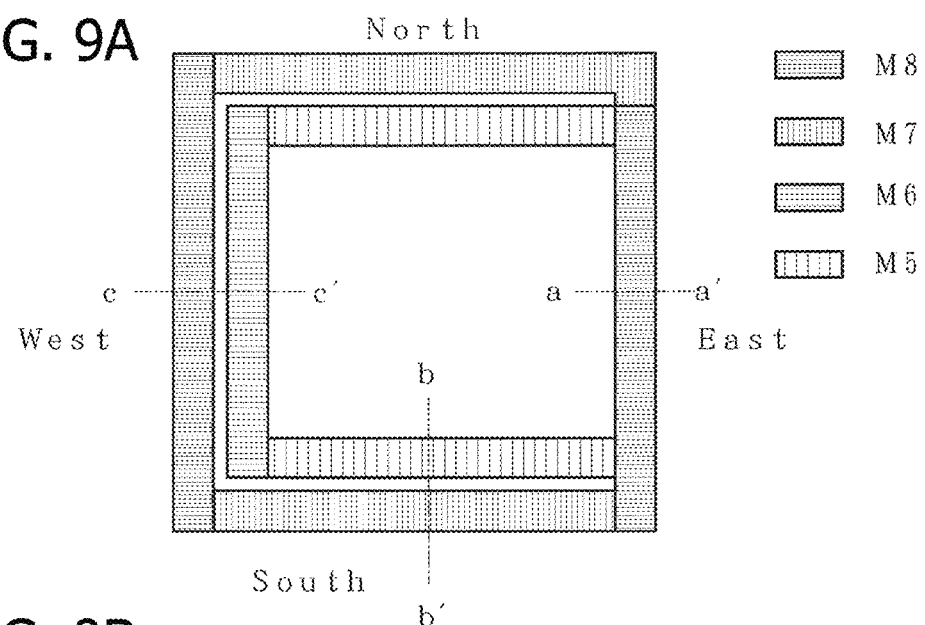
FIGS. 9A and 9B are diagrams illustrating the layered structured of a multilayer solenoid coil used in the semiconductor chip according to Example 3 of the present invention.
Figure 9B:
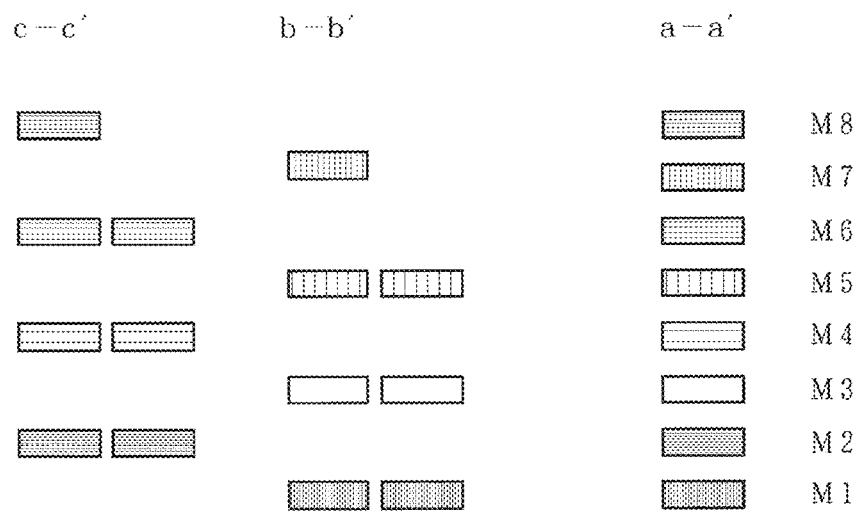

Next, a multilayer solenoid coil used in the semiconductor chip according to Example 3 of the present invention is described in reference to FIGS. 9A and 9B. The way in which this multilayer solenoid coil is wound can be expressed as follows in the order of east, north, west and south.

↑M8 (Port)
↑↑'M7—M7↑M8↓M7
↑M6↓m5↑m6↓m5
↑↑'M5—M5↑M6↓M5
↑M4↓m3↑m4↓m3
↑↑'M3—M3↑M4↓M3
↑m2↓m1↑m2↓m1
M1—M1↑M2↓M1

In this case as well, the north, west and south sides are inner wires at the odd-numbered windings. Here, ↑↑ means the connection to a wire at a level two layers above through two vias.

FIGS. 9A and 9B are diagrams illustrating the layer structure of a multilayer solenoid coil used in the semiconductor chip according to Example 3 of the present invention. FIG. 9A is a plan diagram, and FIG. 9B is a cross-sectional diagram along chain lines a-a', b-b' and c-c' in FIG. 9A. As is clear from FIG. 9B, all the seven layers have an east side, and the east sides are aligned as viewed in the direction in which the layers are layered. Only the even-numbered layers or only the odd-numbered layers have the other sides, north, west and south, so that the power lines and the signal wires can traverse three-dimensionally. Thus, in Example 3 of the present invention as well, the wire concentration is the highest along the east side that faces the multilayer solenoid coil provided in another semiconductor chip, and therefore, the coupling coefficient and the mutual inductance M can be increased as compared to plane spiral coils.

Example 4

Figure 10A:
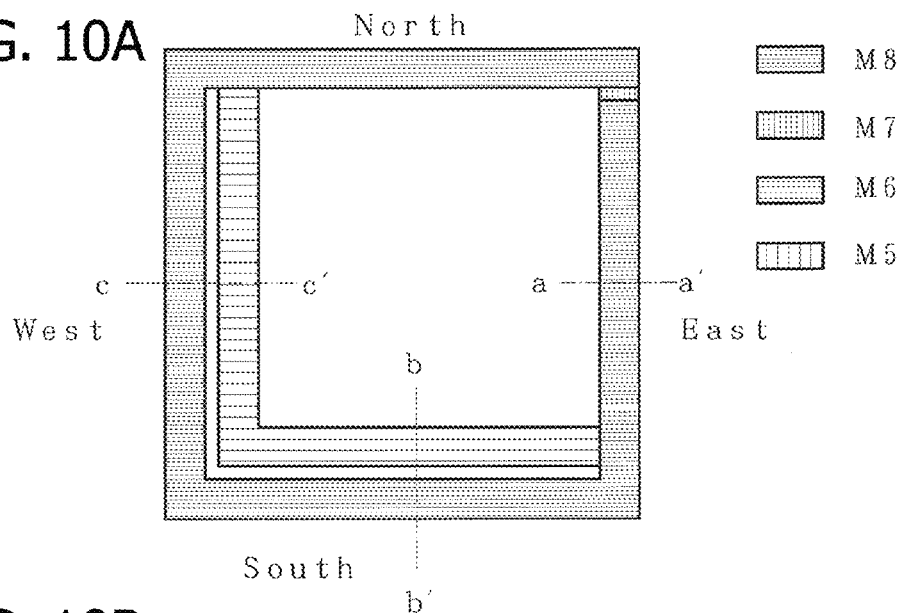
FIGS. 10A and 10B are diagrams illustrating the layered structured of a multilayer solenoid coil used in the semiconductor chip according to Example 4 of the present invention.
Figure 10B:
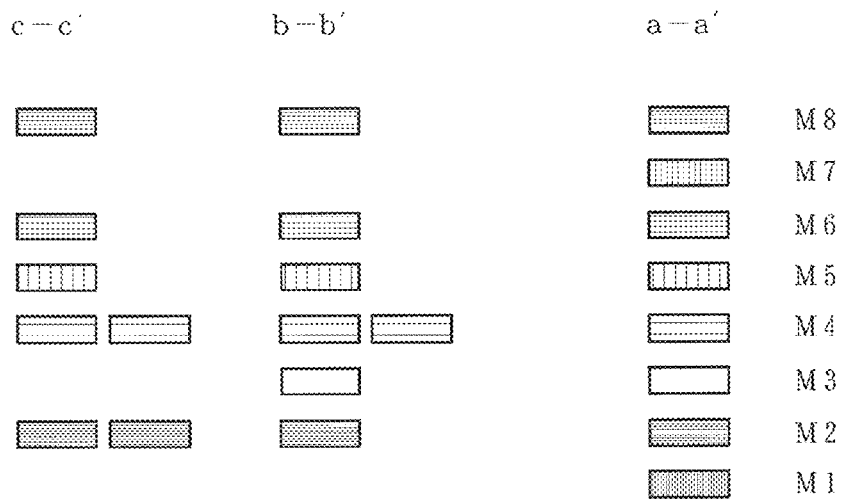

Next, a multilayer solenoid coil used in the semiconductor chip according to Example 4 of the present invention is described in reference to FIGS. 10A and 10B. The way in which this multilayer solenoid coil is wound can be expressed as follows in the order of east, north, west and south.

M8
M7M8M8M8
M6M6M6M6
M5M5M5M5
M4M4M4M4
M3M3M4M4
M2M2M2M3
M1M1M2M2

FIGS. 10A and 10B are diagrams illustrating the layer structure of a multilayer solenoid coil used in the semiconductor chip according to Example 4 of the present invention. FIG. 10A is a plan diagram, and FIG. 10B is a cross-sectional diagram along chain lines a-a', b-b' and c-c' in FIG. 10A. As is clear from FIG. 10B, all the seven layers have an east side, and the east sides are aligned as viewed in the direction in which the layers are layered. In this case, a signal wire using M1 and M3 enters into the coil through the west side, and a power line and the GND line using M7 can pass through the north and south sides. In Example 4, the number of vias is smaller as compared to Examples 1 through 3, and therefore, the parasitic resistance is reduced, which makes communication at a higher rate possible.

Example 5

Figure 11:
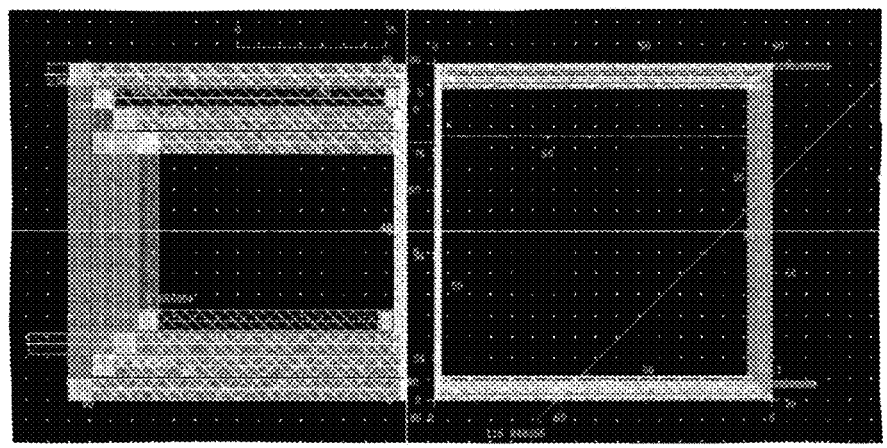
FIG. 11 is a diagram illustrating the transmission and reception coils used for the simulation according to Example 5 of the present invention.

Next, a multilayer solenoid coil used in the semiconductor chip according to Example 5 of the present invention is described in reference to FIG. 11. In Example 5, the multilayer solenoid coil in Example 1 additionally has a smaller multilayer solenoid coil wound in the same way incorporated inside the hollow core of the multilayer solenoid coil in Example 1 where the multilayer solenoid coils are electrically connected in series. The way in which this multilayer solenoid coil is wound can be expressed as follows in the order of east, north, west and south.

The wire goes up winding like:
M8 (Port)
M7M8M9M8 ($7^{th}$ winding)
M6M6M7M6 ($6^{th}$ winding)
M5M6M7M6 ($5^{th}$ winding)
M4M4M5M4 ($4^{th}$ winding)
M3M4M5M4 ($3^{rd}$ winding)
M2M2M3M2 ($2^{nd}$ winding)
M1M2M3M2 ($1^{st}$ winding),
and after that goes inward and goes down winding like:
(M8) M8M7M8
  M7M8M7M8 ($7^{th}$ winding)
  M6M6M5M6 ($6^{th}$ winding)
  M5M6M5M6 ($5^{th}$ winding)
  M4M4M3M4 ($4^{th}$ winding)
  M3M4M3M4 ($3^{rd}$ winding)
  M2M2M1M2 ($2^{nd}$ winding)
  M1M2M1M2 ($1^{st}$ winding).

Of course, the wire is formed starting from the first layer in the actual manufacturing process.

As the number n of windings of a multilayer spiral coil increases, the mutual inductance M ideally increases in proportion to n to the power of 1.6 to 1.8. In the case where the wire is wound in a spiral towards the inside of the coil when the number of windings of the coil is greater than the number of wire layers in the multilayer wire structure as in Example 5, the distance between the facing sides increases, which causes the mutual inductance M to lower. Therefore, it is desired to make the line width of the facing sides as narrow as possible so that the distance between the facing sides is prevented from becoming very large. When the line width is made narrower, however, the parasitic resistance increases, thereby preventing a large current from flowing through the transmission coil, which makes a change in the transmission current smaller or makes the bandwidth in the reception coil narrower, and thus, high rate communication cannot be achieved. Meanwhile, the sides (north and south) that are orthogonal to the facing sides do not greatly affect M between the facing sides (in the orthogonal direction). Furthermore, the west sides do not greatly affect M even when they become thicker in the direction in which the location goes further away from the facing sides (east). Accordingly, the line width of the east sides is ½ of the line width of the other sides, and as a result, the mutual inductance M can be increased without increasing the resistance value of the coil as a whole.

FIG. 11 is a diagram illustrating the transmission and reception coils used for the simulation. Both the transmission and reception coils are coils of 16 windings of which the outermost square has sides of 80 μm. In addition, the line width of the facing sides is ½ of the line width of the other sides in both the transmission and reception coils. As a result of the simulation, the coupling coefficient was 0.097, which is not very different from that between the multilayer solenoid coils without inner coils because the distance between the inner multilayer solenoid coils is not very different from the distance between the outer multilayer solenoid coils due to the fine line width of the facing sides. However, the number of windings is two times greater, and thus, the mutual inductance M was 2.89, which is 3.2 times greater than that in Example 1. Accordingly, the communication distance can be increased as compared to Example 1 and the distance between the chips can be increased. Alternatively, communication can be achieved with low power and low energy consumption.

In the case of a multilayer solenoid coil wound in the same way as that in any of Examples 2 through 4, the multilayer solenoid coil may be provided as an outer multilayer solenoid coil having an additional multilayer solenoid coil wound in the same way inside. Alternatively, the outer multilayer solenoid coil and the inner multilayer solenoid coil may be wound in ways different from each other. Furthermore, the line width of the east sides may be ½ the line width of the other sides even in the case where an inner multilayer solenoid coil is not provided.

Example 6

Figure 12:
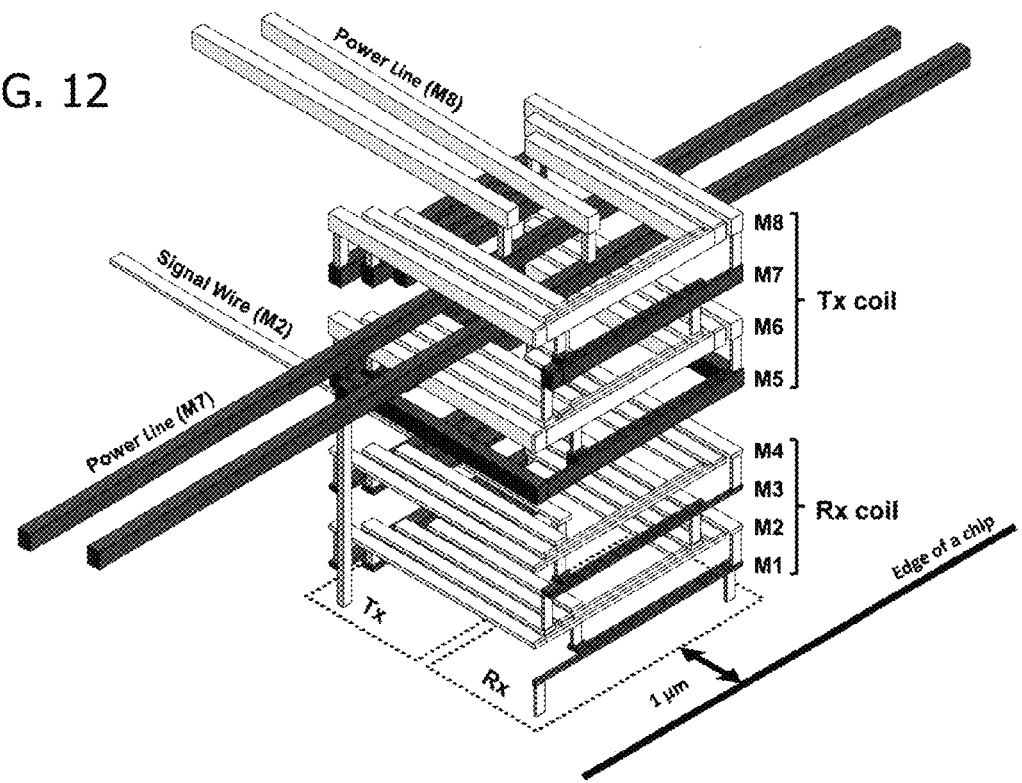
FIG. 12 is a perspective diagram illustrating a multilayer solenoid coil used in the multi-chip module according to Example 6 of the present invention.
Figure 13:
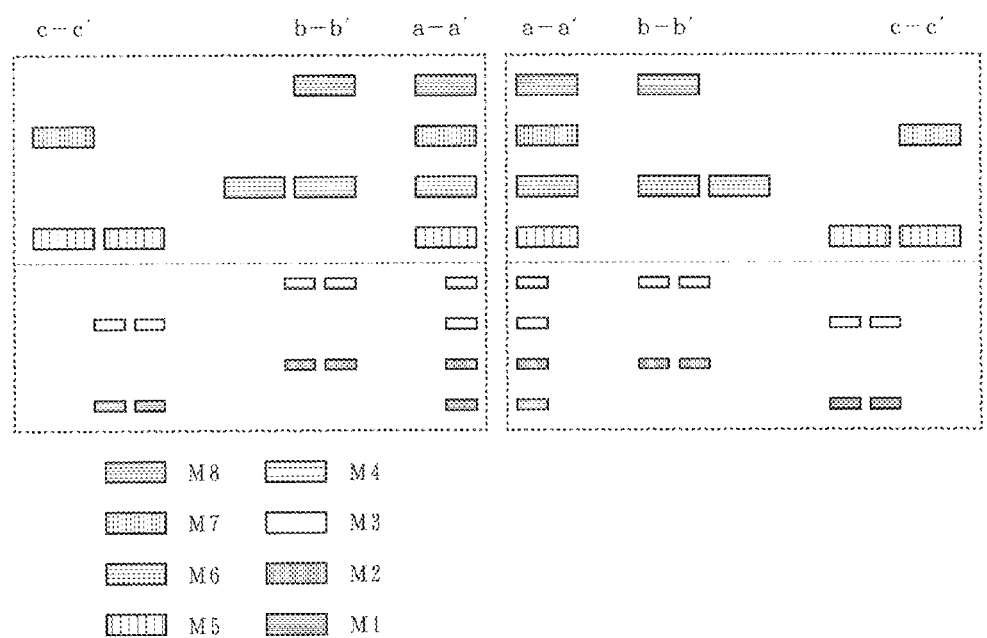
FIG. 13 is a diagram illustrating the multi-chip module according to Example 6 of the present invention.

Next, the multi-chip module according to Example 6 of the present invention is described in reference to FIGS. 12 and 13. FIG. 12 is a perspective diagram illustrating a multilayer solenoid coil used in the multi-chip module according to Example 6 of the present invention. In the first and second semiconductor chips, the coil for transmission through which a large amount of current can flow is wound with a wire provided in M8, M7, M6 and M5, which are thick upper wire layers, and the coil for reception through which a small amount of current can flow is wound with a wire provided in M4, M3, M2 and M1, which are thin lower wire layers. Here, a power line is provided using M7 and M8.

FIG. 13 is a diagram illustrating the multi-chip module according to Example 6 of the present invention. The diagram illustrates cross-sections of the respective portions of the multilayer solenoid coil along chain lines a-a', b-b' and c-c' in the same manner as in FIG. 4B. As illustrated in FIG. 13, the corresponding portions of the transmission coil and the reception coil are in locations different from each other in the direction in which the layers are layered, and thus, the communication distance is slightly longer than the distance between the chips. In an electromagnetic field simulation, however, the mutual inductance M was 0.13 nH for solenoid coils wound with a wire in four layers in the case of D=40 μm and d=3 μm. In the case where the number of windings is increased from 4 to 24 by winding the wire in a spiral, M is increased by 25 times to 3.3 nH. Typically, M needs to be 1 nH or greater for magnetic field coupling communication. The mutual inductance M is proportional to the distance d approximately to the power ⅓, and therefore, it was found by counting backwards that D=40 μm can make connection over a distance of d=5 μm possible. The distance d that makes communication possible is proportional to D of the coils, and therefore, d<<D/8 can be the standard for the design.

Example 7

Figure 14:
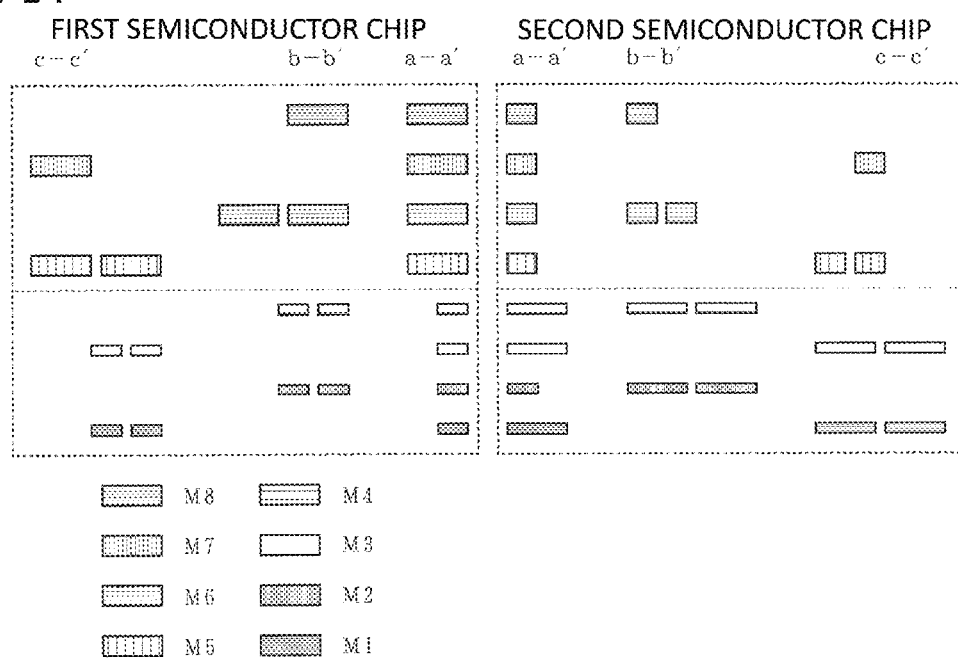
FIG. 14 is a diagram illustrating the multi-chip module according to Example 7 of the present invention.

Next, the multi-chip module according to Example 7 of the present invention is described in reference to FIG. 14. FIG. 14 is a diagram illustrating the multi-chip module according to Example 7 of the present invention. The diagram illustrates cross-sections of the respective portions of the multilayer solenoid coil along chain lines a-a', b-b' and c-c' in the same manner as in FIG. 4B. As illustrated in FIG. 14, in the first semiconductor chip, the coil for transmission is wound with a wire provided in M8, M7, M6 and M5, which are thick upper wire layers, and the coil for reception is wound with a wire provided in M4, M3, M2 and M1, which are thin lower wire layers. Meanwhile, in the second semiconductor chip, the coil for reception is wound with a wire provided in M8, M7, M6 and M5, which are thick upper wire layers, and the coil for transmission is wound with a wire provided in M4, M3, M2 and M1, which are thin lower wire layers. In this case, the locations of the transmission coil and the reception coil are almost the same in the direction in which the layers are layered which makes the communication distance shorter than that in Example 6.

Example 8

Figure 15:
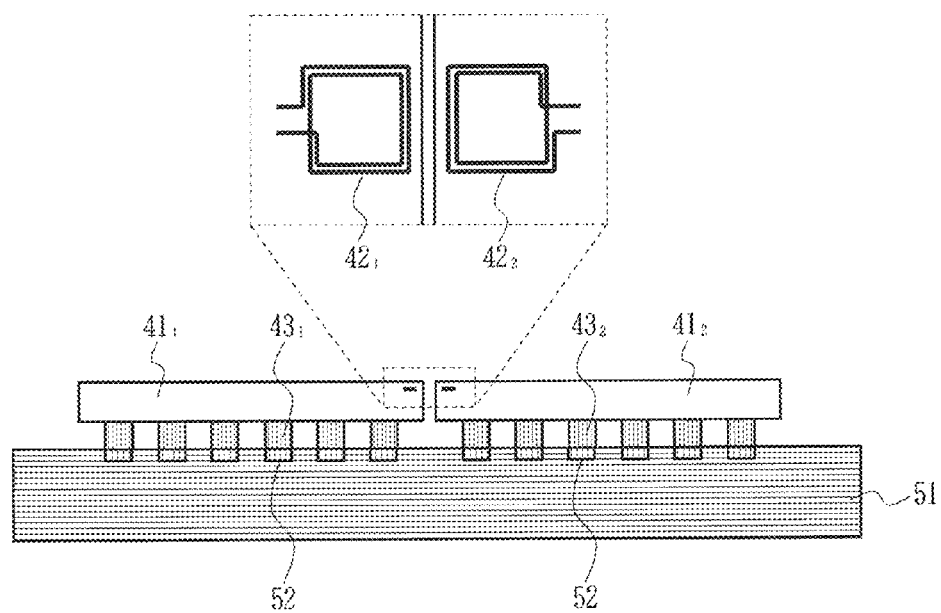
FIG. 15 is a diagram illustrating the mounting structure in the multi-chip module according to Example 8 of the present invention.

Next, the multi-chip module according to Example 8 of the present invention is described in reference to FIGS. 15 through 21B. FIG. 15 is a diagram illustrating the mounting structure of the multi-chip module according to Example 8 of the present invention. Here, coils having the same structure as the coils in Example 7 are used as the multilayer solenoid coils $42_1$ and $42_2$ that are provided in semiconductor chips $41_1$ and $41_2$. Cu pillars $43_1$ and $43_2$ are used to flip-chip bond the semiconductor chips $41_1$ and $41_2$ to a package substrate 51 on which pads 52 are formed. At this time, the semiconductor chips $41_1$ and $41_2$ are mounted so that the multilayer solenoid coils $42_1$ and $42_2$ provided therein face each other. The typical test chips were manufactured in a 0.18 μm-CMOS process, and dicing was carried out by means of laser ablation.

Figure 16:
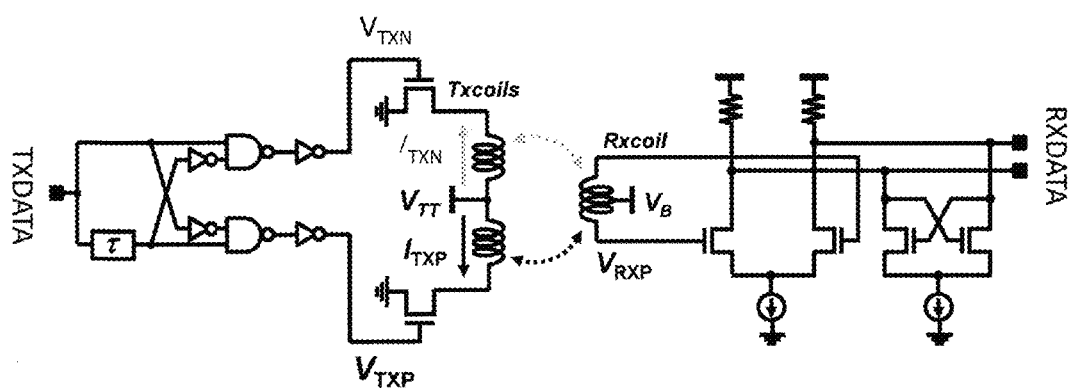
FIG. 16 is a diagram illustrating transmission and reception circuits used for the multi-chip module according to Example 8 of the present invention.

FIG. 16 is a diagram illustrating the transmission and reception circuits used for the multi-chip module according to Example 8 of the present invention. Here, a turn-off transmit type transmission circuit where two transmission coils are used to increase dI/dt is used.

Figure 17A:
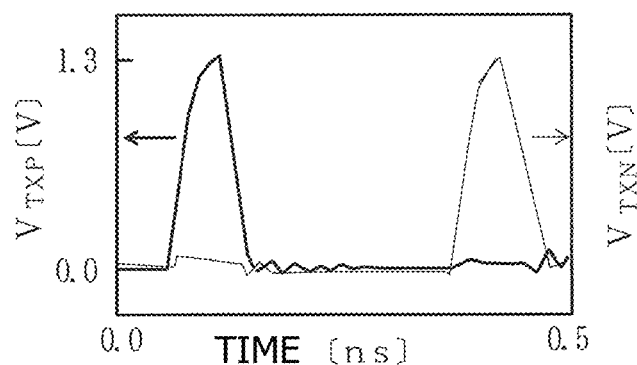
FIGS. 17A through 17C are diagrams illustrating signal wave forms.
Figure 17B:
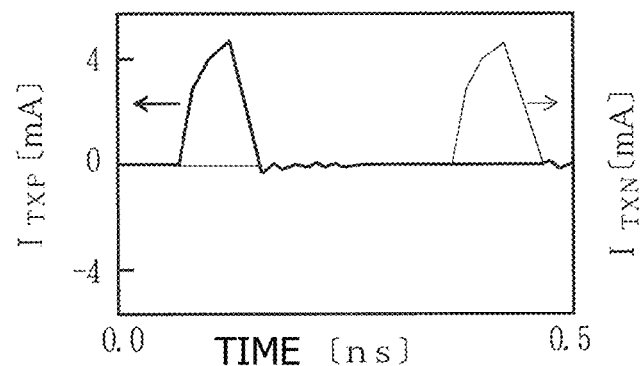
Figure 17C:
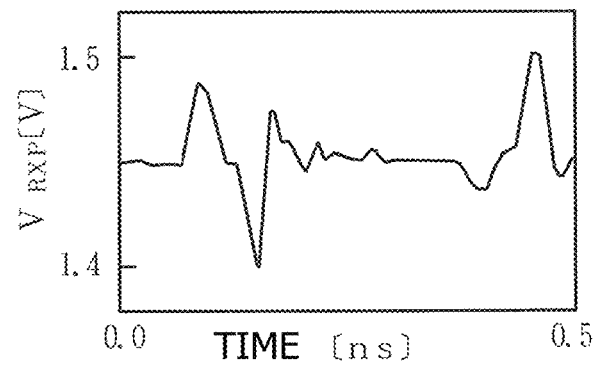

FIGS. 17A through 17C are diagrams illustrating signal waveforms. As illustrated in FIG. 17A, in accordance with the transmitted data $T_{xdata}$, an NMOS is slowly turned on in such a manner as to pull a bow string, and the NMOS is quickly turned off in such a manner as to release the bow string. As illustrated in FIG. 17B, when the NMOS is turned on, an electromotive force is induced in the coil so as to prevent the current $I_{TXP}$ from increasing, and the drain voltage in the NMOS lowers so that the NMOS operates in the triode region. As a result, the transconductance $\beta V_{DS}$ is lowered. Meanwhile, when the NMOS is turned off, an electromotive force is induced in the coil so as to prevent the current $I_{TXP}$ from decreasing, and the drain voltage of the NMOS increases so that the NMOS operates in the saturation region. As a result, the transconductance $\beta V_{eff}$ is increased. FIG. 17C illustrates the voltage generated in the coil on the reception side.

That is to say, dI/dt is greater when the current of the coil is turned off as in the present system than when a current is made to flow through the coil as in the transmission and reception circuits in FIG. 6. In a simulation, dI/dt could be made 1.5 times greater as compared to the H bridge circuit in FIG. 6. Furthermore, only NMOS is used, and therefore, the layout area can be made smaller to ⅓ as compared to the H bridge circuit where both NMOS and PMOS are used. As a result, the transmitter/receiver can be contained beneath the coil of D=40 μm even in the case where a 0.18 μm-CMOS technology is used. In addition, the power supply voltage can be lowered by the voltage drop in PMOS (0.7 $V_{DD}$), and furthermore, the power consumption can be reduced to ⅙ because no stationary current is consumed for pulse driving.

Figure 18:
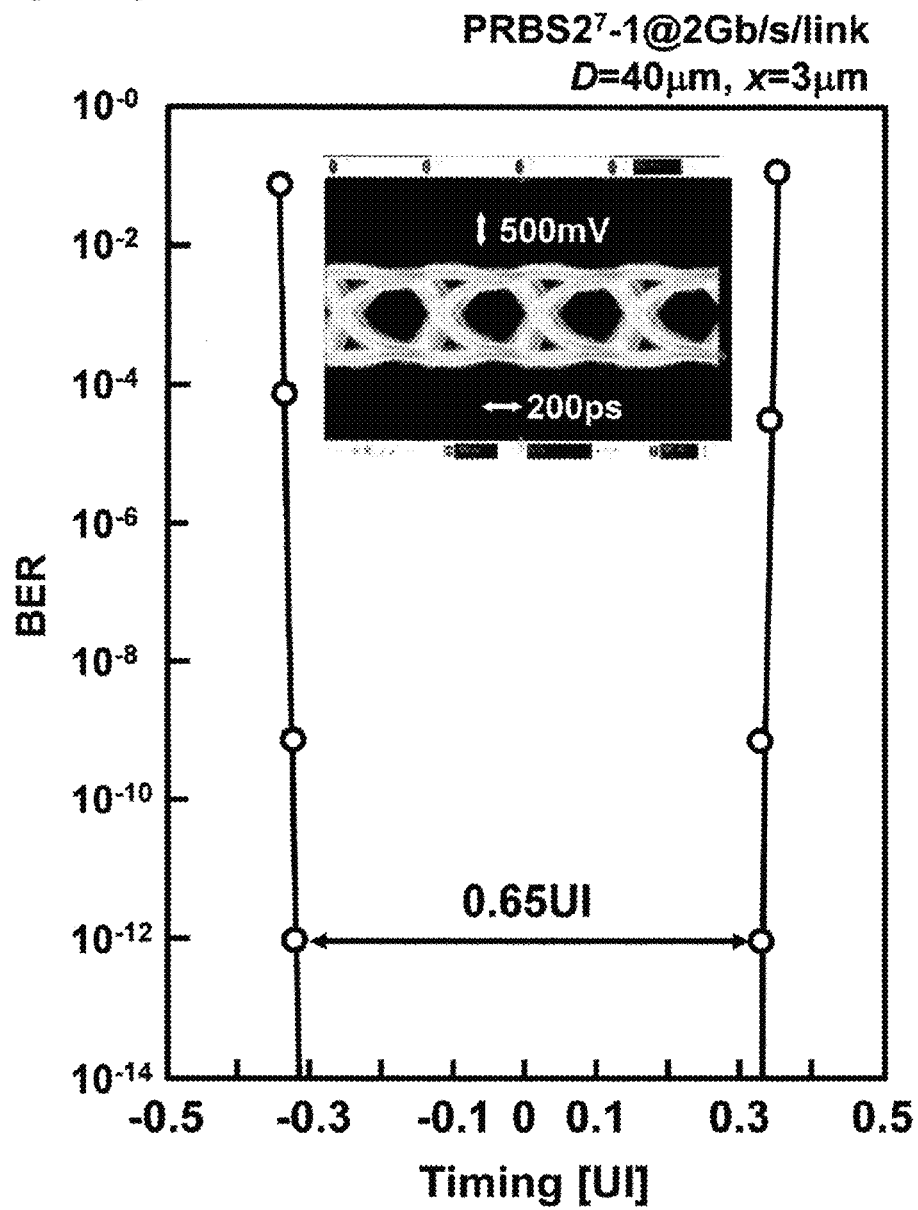
FIG. 18 is a diagram illustrating the relationship between BER and the timing.

FIG. 18 is a diagram illustrating the mutual relationship between the BER (bit error rate) and the timing. A PRBS$2^7$-1 signal of 2 Gb/s/link was used for a communication experiment. When a coil of D=40 μm with 516 channels per 1 mm$^2$ was formed, a total communication band of 1 Tb/s/mm$^2$ was gained. The timing margin at which BER became $10^{-12}$ was 0.65–UI.

Figure 19A:
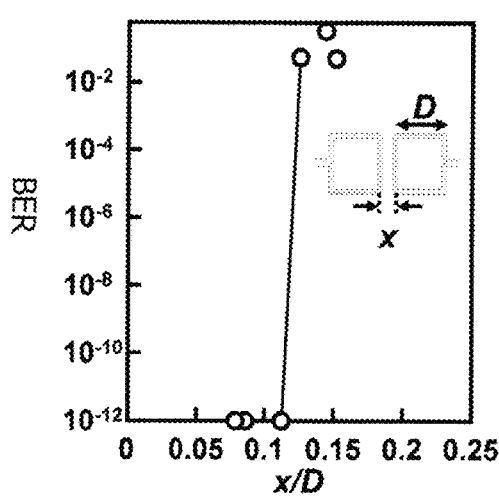
FIGS. 19A and 19B are diagrams illustrating the correlation between BER and the coil distance.
Figure 19B:
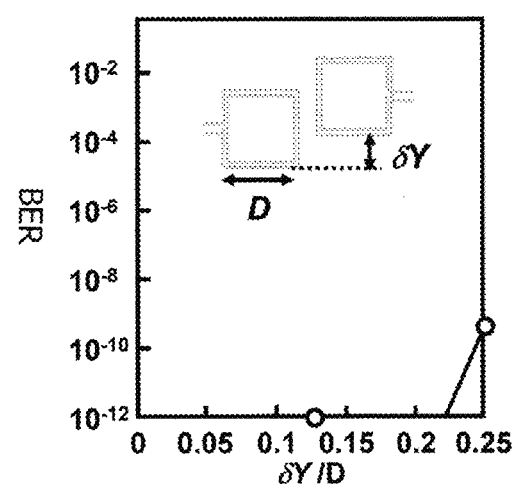

FIG. 19A is a diagram illustrating the correlation between BER and the distance between coils in the case where there is no positional shifting. FIG. 19B is a diagram illustrating the correlation between BER and the distance between coils in the case where there is positional shifting. When the power supply voltage was 1.4V, the power consumption was 4.2 mW in the transmitter and 3.7 mW in the receiver, and thus was 7.9 mW in total (4 pJ/b). As illustrated in FIG. 19A, channels with different pitches (p) of a coil were used, and a dedicated manipulator was used to change the communication distance (x) so as to carry out a communication experiment. As a result, communication was possible for BER<$10^{-12}$ in all the cases where the pitch was p=1.1 D, 1.5 D and 2 D. In addition, the communication distance was x≤5 μm (=0.13 D). Furthermore, as illustrated in FIG. 19B, communication was possible when the positional shift was δ≤8 μm (=0.2 D).

Figure 20A:
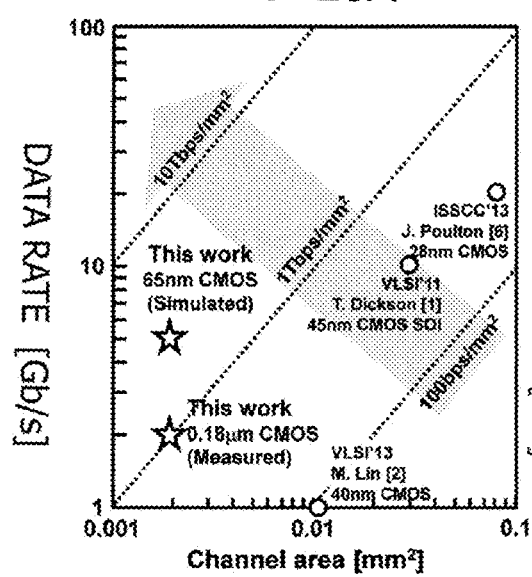
FIGS. 20A and 20B are graphs illustrating the transfer rate and the power consumption.
Figure 20B:
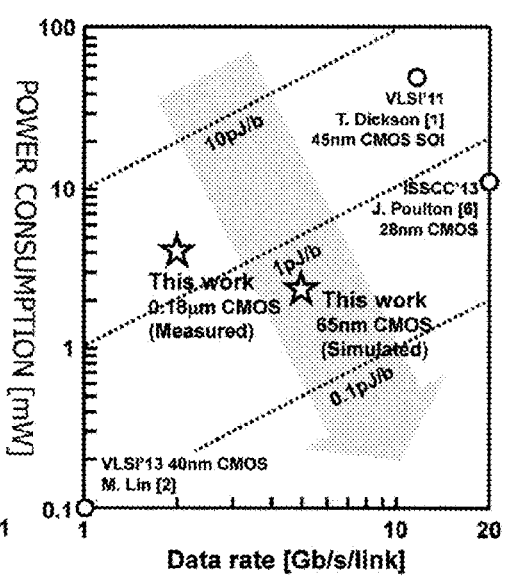

FIGS. 20A and 20B are graphs illustrating the transfer rate and the power consumption. FIG. 20A is a graph illustrating the correlation between the data rate that indicates the transfer rate and the channel area. FIG. 20B is a graph illustrating the correlation between the data rate that indicates the power consumption and the channel area. When the results of the experiment are compared to the achievements of the cutting edge research, the density, that is, the number of channels per 1 mm$^2$, can be increased 15 times higher, and the communication rate can be increased three times (1 Tb/s/mm$^2$) faster than in the Si interposer system by using magnetic field coupling.

The transmission and reception circuits fabricated in accordance with a 0.18 pin-CMOS technology have a transfer rate that is lower than the bandwidth of the coils (9 Gbps/coil) and a layout area that is smaller than the size of the coils (D=40 μm), and therefore, the transfer rate and the power consumption can be improved by using a finer CMOS technology. For example, in a simulation using parameters in accordance with a 65 nm-CMOS technology, the communication rate was 3.2 Tb/s/mm$^2$ as illustrated in FIG. 20A, and the power consumption was 0.4 pJ/b as illustrated in FIG. 20B.

The magnetic field communication technology provides AC connections, and therefore, different types of chips having different power supply voltages can be easily connected. In addition, CPUs and FPGAs manufactured in a cutting edge process can be connected to MPUs and I/O chips manufactured in an older process so that the IP license fees and the development costs can be saved on.

FIG. 21A is a graph illustrating the area efficiency (Tb/s/mm$^2$) of data transfer, and FIG. 21B is a graph illustrating the power efficiency (Tb/s/W (pJ/b)) of data transfer. Here, the hysteresis differential comparator receiver circuit in FIG. 16 was used for a simulation with the parameters in accordance with a 65 nm-CMOS technology.

In the case where coils of D=40 μm were used for a communication distance x=3 μm, the area efficiency was 3.2 Tb/s/mm$^2$ as illustrated in FIG. 21A, and the power efficiency was 2.3 Tb/s/W (=0.43 pJ/b) as illustrated in FIG. 21B. This can be compared with the transfer at 10 Gb/s/link using a silicon interposer to find that the area efficiency could be increased by seven times and the power efficiency could be increased by ten times. As is clear from FIGS. 21A and 21B, communication is possible even in the case where the communication distance x is 20 μm. As described above, it is possible to die bond two semiconductor chips at a distance of 1 μm, and therefore, the facing sides of the coils can be provided within a range of 9.5 μm from the side end surfaces of the semiconductor chips in order to make communication possible.

Example 9

Figure 22:
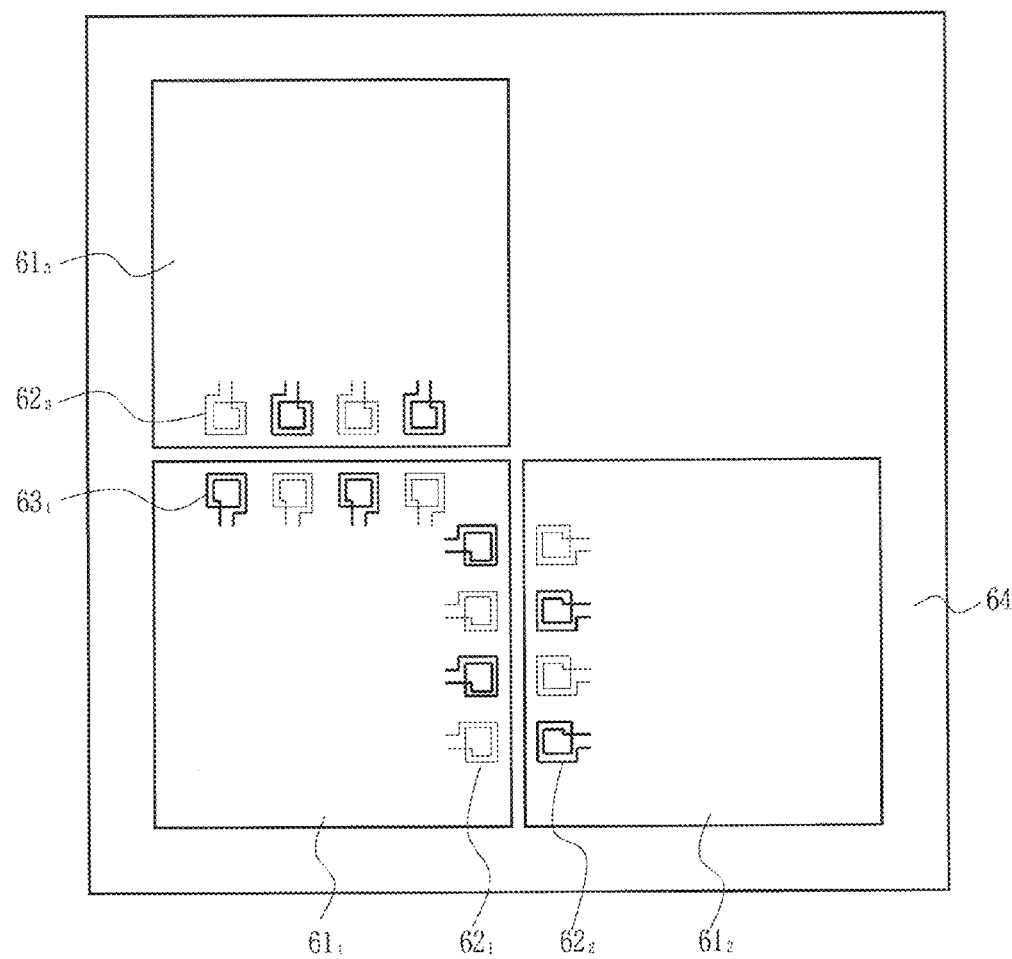
FIG. 22 is a plan diagram illustrating the multi-chip module according to Example 9 of the present invention.
Figure 23:
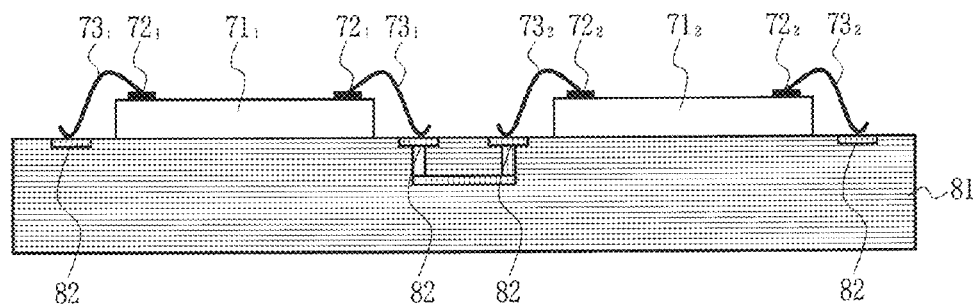
FIG. 23 is a diagram illustrating a conventional mounting structure using bonding wires.
Figure 24:
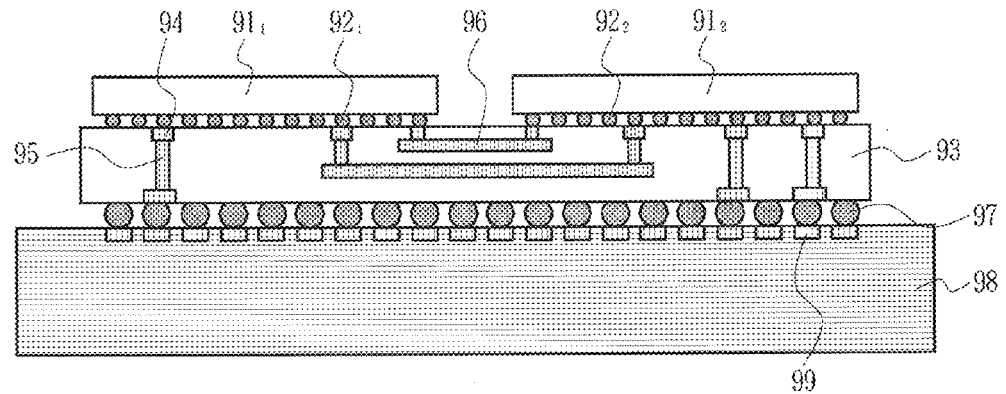
FIG. 24 is a diagram illustrating a conventional mounting structure using a silicon interposer.
Figure 25:
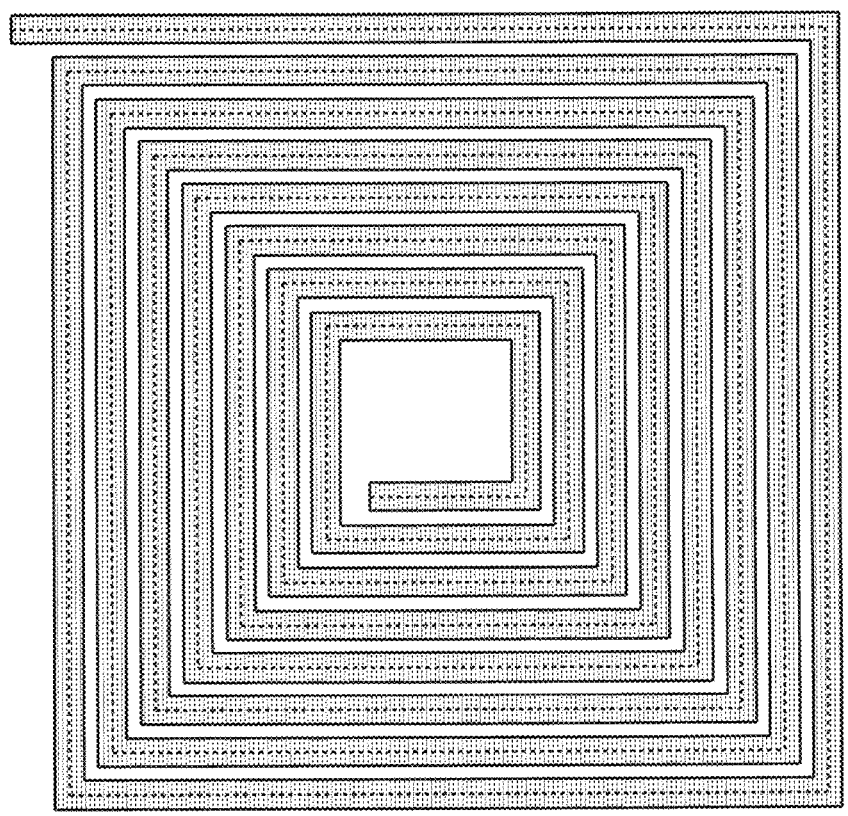
FIG. 25 is a plan diagram illustrating a plane spiral coil used for a simulation.
Figure 26:
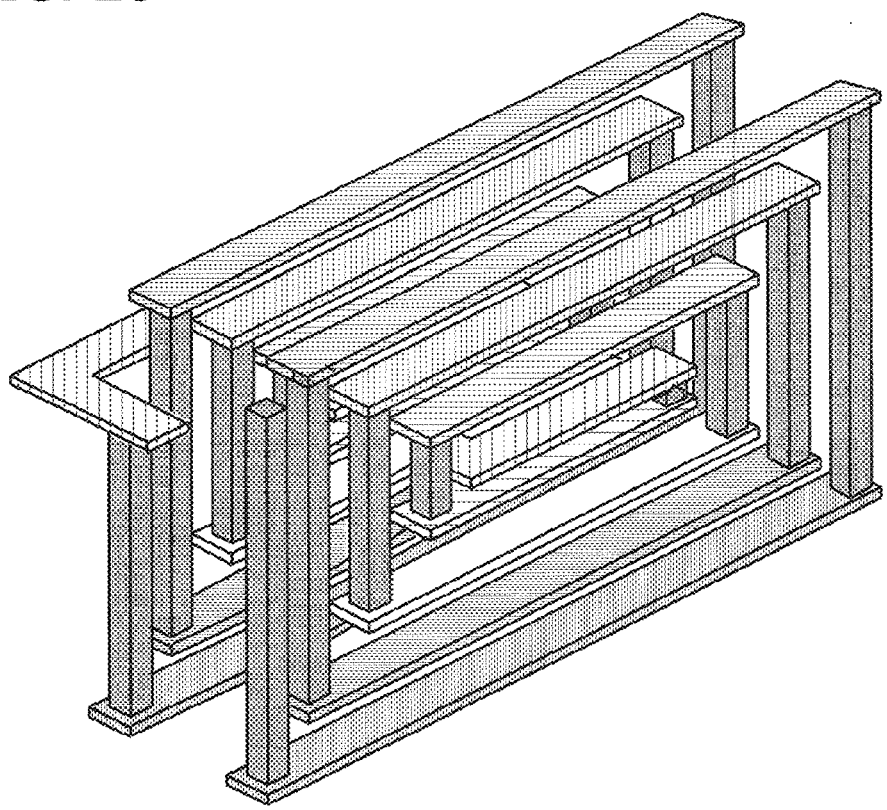
FIG. 26 is a schematic perspective diagram illustrating a coil in a multilayer wiring structure used for a simulation.

Next, the multi-chip module according to Example 9 of the present invention is described in reference to FIG. 22. FIG. 22 is a plan diagram illustrating the multi-chip module according to Example 9 of the present invention, where multilayer solenoid coils $62_1$ and $63_1$ are arranged along two sides of a first semiconductor chip $61_1$, and a second semiconductor chip $61_2$ and a third semiconductor chip $61_3$ provided with multilayer solenoid coils $62_2$ and $62_3$ are mounted on a package substrate 64 so that the multilayer solenoid coils $62_2$ and $62_3$ face the multilayer solenoid coils $62_1$ and $63_1$ along the respective sides.

In this case, the first semiconductor chip $61_1$ may be a control chip, and the second semiconductor chip $61_2$ and the third semiconductor chip $61_3$ may be memories. In addition, multilayer solenoid coils may be provided along the four sides of the first semiconductor chip $61_1$ so that four semiconductor chips can be mounted so as to face the first semiconductor chip $61_1$. Furthermore, multilayer solenoid coils ($63_2$) may be provided in the second semiconductor chip $61_2$ along a side other than the side through which the first semiconductor chip $61_1$ faces the second semiconductor chip $61_2$ so that a sixth semiconductor chip can be mounted so as to face the second semiconductor chip $61_2$.

What is claimed is:
1. A semiconductor chip, comprising:
    a semiconductor body; and
    a multilayer solenoid coil, where a plane of the coil formed in a multilayer wiring structure in the semiconductor body is parallel to a main surface of the semiconductor body, wherein
    the multilayer solenoid coil is formed along at least one side end surface of the semiconductor body, and
    the sides in the respective layers of the multilayer solenoid coil on the side end surface side are aligned in the direction in which the layers of the multilayer solenoid coil are layered.
2. The semiconductor chip according to claim 1, wherein at least one side of the multilayer solenoid coil is provided within a range of 9.5 μm from the side end surface of the semiconductor body.

3. The semiconductor chip according to claim 2, wherein at least one side of the multilayer solenoid coil is provided within a range of 5 μm from the side end surface of the semiconductor body.

4. The semiconductor chip according to claim 1, wherein at least one side other than the side of each layer of the multilayer solenoid coil on the side end surface side forms a spiral.

5. The semiconductor chip according to claim 1, wherein the width of the side of each layer of the multilayer solenoid coil on the side end surface side is narrower than the width of the other sides.

6. The semiconductor chip according to claim 1, wherein the wire concentration in the location where the sides of the multilayer solenoid coil are aligned in the direction in which the layers are layered along one side on the side end surface side is higher than the wire concentration in the locations where the sides are aligned in the direction in which the layers are layered along the other three sides.

7. The semiconductor chip according to claim 6, wherein at least a power line or a signal wire is provided so as to pass through the multilayer solenoid coil in a horizontal direction.

8. The semiconductor chip according to claim 1, wherein odd-numbered wound coil elements of the multilayer solenoid coil are formed of first wire elements located outside, and even-numbered wound coil elements of the multilayer solenoid coil are formed of first wire elements located along the side end surface and second wire elements located inside the first wire elements.

9. The semiconductor chip according to claim 1, wherein the multilayer solenoid coil has in its inside an inner multilayer solenoid coil wound with wires that shares the multilayer structure with the winding wires of the multilayer solenoid coil, where the multilayer solenoid coil and the inner multilayer solenoid coil are electrically connected in series.

10. The semiconductor chip according to claim 1, wherein the multilayer solenoid coil is one of the multilayer solenoid coils for reception or one of the multilayer solenoid coils for transmission that are aligned in a lateral direction.

11. The semiconductor chip according to claim 1, wherein the multilayer solenoid coil is a multilayer solenoid coil made of a multilayer solenoid coil for reception and a multilayer solenoid coil for transmission layered on top of each other.

12. The semiconductor chip according to claim 1, wherein multilayer solenoid coils are provided along at least two side end surfaces of the semiconductor body.

13. A multi-chip module, comprising:
a mounting substrate;
a first semiconductor chip mounted on the mounting substrate; and
a second semiconductor chip mounted on the mounting substrate, wherein
the first semiconductor chip comprises a multilayer solenoid coil, where a plane of the coil formed along at least a first side end surface of a first semiconductor body is parallel to a main plane of the first semiconductor body,
the second semiconductor chip comprises a multilayer solenoid coil, where a plane of the coil formed along at least a first side end surface of a second semiconductor body is parallel to a main plane of the second semiconductor body,
the multilayer solenoid coil provided in the first semiconductor chip and the multilayer solenoid coil provided in the second semiconductor chip face each other, the sides in the respective layers of the multilayer solenoid coil provided in the first semiconductor chip on the side end surface side are aligned in the direction in which the layers of the multilayer solenoid coil are layered, and
the sides in the respective layers of the multilayer solenoid coil provided in the second semiconductor chip on the side end surface side are aligned in the direction in which the layers of the multilayer solenoid coil are layered.

14. The multi-chip module according to claim 13, wherein one side of the multilayer solenoid coil provided in the first semiconductor chip and one side of the multilayer solenoid coil provided in the second semiconductor chip face each other at a distance of 9.5 μm or less.

15. The multi-chip module according to claim 14, wherein the height of the center of the multilayer solenoid coil provided in the first semiconductor chip in the direction in which the layers are layered is the same as the height of the center of the multilayer solenoid coil provided in the second semiconductor chip in the direction in which the layers are layered.

16. The multi-chip module according to claim 14, wherein the height of the center of the multilayer solenoid coil provided in the first semiconductor chip in the direction in which the layers are layered shifts by a distance of 5 μm or less from the height of the center of the multilayer solenoid coil provided in the second semiconductor chip in the direction in which the layers are layered.

17. The multi-chip module according to claim 13, wherein
a multilayer solenoid coil having the same structure as that of the multilayer solenoid coil provided in the first semiconductor chip is provided along a second side end surface of the first semiconductor body,
a third semiconductor chip comprises a multilayer solenoid coil, where a plane of the coil formed along at least a first side end surface of a third semiconductor body is parallel to a main plane of the first semiconductor body, and
the third semiconductor chip is mounted on the mounting substrate in such a manner that the multilayer solenoid coil of the third semiconductor chip faces the multilayer solenoid coil provided along the second side end surface.

* * * * *